United States Patent
Pearson et al.

(10) Patent No.: US 10,748,793 B1
(45) Date of Patent: Aug. 18, 2020

(54) PRINTING COMPONENT ARRAYS WITH DIFFERENT ORIENTATIONS

(71) Applicant: X-Celeprint Limited, Cork (IE)

(72) Inventors: Andrew Tyler Pearson, Durham, NC (US); Erich Radauscher, Raleigh, NC (US); Christopher Michael Verreen, Raleigh, NC (US); Matthew Alexander Meitl, Durham, NC (US); Christopher Andrew Bower, Raleigh, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/274,969

(22) Filed: Feb. 13, 2019

(51) Int. Cl.
| | |
|---|---|
| *H01L 21/67* | (2006.01) |
| *H01L 25/075* | (2006.01) |
| *B65G 47/90* | (2006.01) |
| *B41F 16/00* | (2006.01) |
| *H01L 33/62* | (2010.01) |

(52) U.S. Cl.
CPC ...... *H01L 21/67144* (2013.01); *B41F 16/006* (2013.01); *B65G 47/90* (2013.01); *H01L 25/0753* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| | | |
|---|---|---|
| 4,934,267 A | 6/1990 | Hashimoto et al. |
| 5,205,032 A | 4/1993 | Kuroda et al. |
| (Continued) | | |

FOREIGN PATENT DOCUMENTS

| | | |
|---|---|---|
| EP | 0281100 B1 | 6/1992 |
| JP | H11-142878 A | 5/1999 |
| (Continued) | | |

OTHER PUBLICATIONS

Arzt, Eduard et al., From Micro to Nano Contacts in Biological Attachment Devices, PNAS, 100(19):10603-10606 (2003).

(Continued)

*Primary Examiner* — J. E. Schoenholtz
(74) *Attorney, Agent, or Firm* — William R. Haulbrook; Michael D. Schmitt; Choate, Hall & Stewart LLP

(57) ABSTRACT

A method of micro-transfer printing comprises providing a component source wafer and components disposed in, on, or over the component source wafer. A destination substrate and a stamp for transferring the components from the component source wafer to the destination substrate is provided. The component source wafer has an attribute or structure that varies across the component source wafer that affects the structure, operation, appearance, or performance of the components. A first array of components is transferred from the component source wafer to the destination substrate with a first orientation. A second array of components is transferred from the component source wafer to the destination substrate with a second orientation different from the first orientation. Components can be transferred by micro-transfer printing and different orientations can be a different rotation, overlap, interlacing, or offset.

20 Claims, 46 Drawing Sheets

(56) References Cited

U.S. PATENT DOCUMENTS

| | | |
|---|---|---|
| 5,550,066 A | 8/1996 | Tang et al. |
| 5,621,555 A | 4/1997 | Park |
| 5,815,303 A | 9/1998 | Berlin |
| 5,882,532 A | 3/1999 | Field et al. |
| 5,900,160 A | 5/1999 | Whitesides et al. |
| 6,025,730 A | 2/2000 | Akram et al. |
| 6,142,358 A | 11/2000 | Cohn et al. |
| 6,180,239 B1 | 1/2001 | Whitesides et al. |
| 6,278,242 B1 | 8/2001 | Cok et al. |
| 6,387,778 B1 | 5/2002 | Bonin et al. |
| 6,555,408 B1 | 4/2003 | Jacobsen et al. |
| 6,577,367 B2 | 6/2003 | Kim |
| 6,717,560 B2 | 4/2004 | Cok et al. |
| 6,756,576 B1 | 6/2004 | McElroy et al. |
| 6,825,559 B2 | 11/2004 | Mishra et al. |
| 6,933,532 B2 | 8/2005 | Arnold et al. |
| 6,969,624 B2 | 11/2005 | Iwafuchi et al. |
| 6,974,711 B2 | 12/2005 | Yanagisawa et al. |
| 6,998,644 B1 | 2/2006 | Boling et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,622,367 B1 | 11/2009 | Nuzzo et al. |
| 7,662,545 B2 | 2/2010 | Nuzzo et al. |
| 7,691,656 B2 | 4/2010 | Bader et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,875,313 B2 | 1/2011 | Blanchet et al. |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,110,425 B2 | 2/2012 | Yun |
| 8,198,621 B2 | 6/2012 | Rogers et al. |
| 8,207,547 B2 | 6/2012 | Lin |
| 8,217,381 B2 | 7/2012 | Rogers et al. |
| 8,261,660 B2 | 9/2012 | Menard |
| 8,333,860 B1 | 12/2012 | Bibl et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,480,942 B2 | 7/2013 | Shannon et al. |
| 8,502,192 B2 | 8/2013 | Kwak et al. |
| 8,506,867 B2 | 8/2013 | Menard |
| 8,558,243 B2 | 10/2013 | Bibl et al. |
| 8,664,699 B2 | 3/2014 | Nuzzo et al. |
| 8,679,888 B2 | 3/2014 | Rogers et al. |
| 8,685,764 B2 | 4/2014 | Chu et al. |
| 8,686,447 B2 | 4/2014 | Tomoda et al. |
| 8,689,687 B2 | 4/2014 | Choi et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,865,489 B2 | 10/2014 | Rogers et al. |
| 8,871,547 B2 | 10/2014 | Chu et al. |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,238,309 B2 | 1/2016 | King et al. |
| 9,240,397 B2 | 1/2016 | Bibl et al. |
| 9,252,375 B2 | 2/2016 | Bibl et al. |
| 9,307,652 B2 | 4/2016 | Bower |
| 9,308,649 B2 | 4/2016 | Golda et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,368,683 B1 | 6/2016 | Meitl et al. |
| 9,401,344 B2 | 7/2016 | Bower et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,548,332 B2 | 1/2017 | Hu et al. |
| 9,550,353 B2 | 1/2017 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,704,821 B2 | 7/2017 | Meitl et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 10,181,483 B2 | 1/2019 | Menard et al. |
| 10,189,243 B2 | 1/2019 | Menard et al. |
| 2001/0040298 A1 | 11/2001 | Baba et al. |
| 2002/0050220 A1 | 5/2002 | Schueller et al. |
| 2002/0158568 A1 | 10/2002 | Satake |
| 2003/0027083 A1 | 2/2003 | Fuller et al. |
| 2003/0117369 A1 | 6/2003 | Spitzer et al. |
| 2003/0141570 A1 | 7/2003 | Chen et al. |
| 2004/0082163 A1 | 4/2004 | Mori et al. |
| 2004/0121568 A1 | 6/2004 | Kim et al. |
| 2004/0130020 A1 | 7/2004 | Kuwabara et al. |
| 2004/0173876 A1 | 9/2004 | Musalem et al. |
| 2004/0192041 A1 | 9/2004 | Jeong et al. |
| 2004/0227886 A1 | 11/2004 | Kimura |
| 2005/0040754 A1 | 2/2005 | Sakurai |
| 2005/0133241 A1 | 6/2005 | Chi et al. |
| 2005/0139103 A1 | 6/2005 | Cracauer et al. |
| 2005/0170621 A1 | 8/2005 | Kim et al. |
| 2005/0202595 A1 | 9/2005 | Yonehara et al. |
| 2005/0285246 A1 | 12/2005 | Haba et al. |
| 2006/0024974 A1 | 2/2006 | Azuri et al. |
| 2006/0051900 A1 | 3/2006 | Shizuno |
| 2007/0029554 A1 | 2/2007 | Nakamura et al. |
| 2007/0037318 A1 | 2/2007 | Kim |
| 2007/0080464 A1 | 4/2007 | Goebel et al. |
| 2007/0120681 A1 | 5/2007 | Yamazaki et al. |
| 2007/0254455 A1 | 11/2007 | Yamaguchi et al. |
| 2008/0054439 A1 | 3/2008 | Malhan et al. |
| 2008/0055581 A1 | 3/2008 | Rogers et al. |
| 2008/0131822 A1 | 6/2008 | Liao et al. |
| 2008/0164575 A1 | 7/2008 | Ikeda et al. |
| 2008/0185705 A1 | 8/2008 | Osborn et al. |
| 2008/0202365 A1 | 8/2008 | Schneider et al. |
| 2008/0212000 A1 | 9/2008 | French et al. |

(56) References Cited

U.S. PATENT DOCUMENTS

| | | |
|---|---|---|
| 2008/0268571 A1 | 10/2008 | Kim |
| 2009/0133914 A1 | 5/2009 | Dellmann et al. |
| 2010/0002402 A1 | 1/2010 | Rogers et al. |
| 2010/0062098 A1 | 3/2010 | Ando et al. |
| 2010/0072495 A1 | 3/2010 | Yamazaki |
| 2010/0123134 A1 | 5/2010 | Nagata |
| 2010/0155989 A1 | 6/2010 | Ishii et al. |
| 2010/0190293 A1 | 7/2010 | Maeda et al. |
| 2010/0224317 A1 | 9/2010 | Kawamura |
| 2010/0265440 A1 | 10/2010 | French et al. |
| 2010/0289115 A1 | 11/2010 | Akiyama et al. |
| 2010/0306993 A1 | 12/2010 | Mayyas et al. |
| 2010/0308008 A1 | 12/2010 | Zhu et al. |
| 2010/0316845 A1 | 12/2010 | Rule et al. |
| 2011/0120754 A1 | 5/2011 | Kondo et al. |
| 2011/0182805 A1 | 7/2011 | DeSimone et al. |
| 2011/0219973 A1 | 9/2011 | Gullentops et al. |
| 2011/0259223 A1 | 10/2011 | Cau et al. |
| 2011/0266670 A1 | 11/2011 | England et al. |
| 2012/0000379 A1 | 1/2012 | Greener et al. |
| 2012/0027557 A1 | 2/2012 | Ashdown et al. |
| 2012/0043130 A1 | 2/2012 | Rathburn |
| 2012/0104624 A1 | 5/2012 | Choi et al. |
| 2012/0118506 A1 | 5/2012 | Kim et al. |
| 2012/0126229 A1* | 5/2012 | Bower .................. H01L 24/20 257/48 |
| 2012/0168776 A1 | 7/2012 | Nakamura et al. |
| 2012/0228669 A1 | 9/2012 | Bower et al. |
| 2012/0256346 A1 | 10/2012 | Ogino et al. |
| 2012/0321738 A1 | 12/2012 | Ishii et al. |
| 2012/0328728 A1 | 12/2012 | Nakatsuka et al. |
| 2013/0068720 A1 | 3/2013 | Taniguchi |
| 2013/0078576 A1 | 3/2013 | Wu et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2013/0309792 A1 | 11/2013 | Tischler et al. |
| 2013/0316487 A1 | 11/2013 | de Graff et al. |
| 2013/0333094 A1 | 12/2013 | Rogers et al. |
| 2013/0337608 A1 | 12/2013 | Kotani et al. |
| 2014/0084450 A1 | 3/2014 | Nielson et al. |
| 2014/0094878 A1 | 4/2014 | Gossler et al. |
| 2014/0104243 A1 | 4/2014 | Sakariya et al. |
| 2014/0159043 A1 | 6/2014 | Sakariya et al. |
| 2014/0264763 A1 | 9/2014 | Meitl et al. |
| 2014/0327132 A1 | 11/2014 | Zhang et al. |
| 2015/0217560 A1 | 8/2015 | Sakamoto et al. |
| 2015/0348926 A1 | 12/2015 | Bower |
| 2016/0020120 A1 | 1/2016 | Bower et al. |
| 2016/0020127 A1 | 1/2016 | Bower et al. |
| 2016/0020131 A1 | 1/2016 | Bower et al. |
| 2016/0020187 A1 | 1/2016 | Okada et al. |
| 2016/0093600 A1 | 3/2016 | Bower et al. |
| 2017/0047303 A1 | 2/2017 | Meitl et al. |
| 2017/0047306 A1 | 2/2017 | Meitl et al. |
| 2017/0103964 A1 | 4/2017 | Bower et al. |
| 2017/0133250 A1 | 5/2017 | Menard et al. |
| 2017/0154819 A1 | 6/2017 | Bower et al. |
| 2017/0173852 A1 | 6/2017 | Moore et al. |
| 2017/0206845 A1 | 7/2017 | Sakariya et al. |
| 2017/0207193 A1 | 7/2017 | Bower et al. |
| 2017/0256521 A1 | 9/2017 | Cok et al. |
| 2017/0338374 A1 | 11/2017 | Zou et al. |
| 2018/0001614 A1 | 1/2018 | Bower et al. |
| 2018/0047601 A1 | 2/2018 | He et al. |
| 2018/0175158 A1 | 6/2018 | Rogers et al. |
| 2019/0300289 A1 | 10/2019 | Cok |
| 2019/0371856 A1* | 12/2019 | Cha .................. H01L 27/156 |

FOREIGN PATENT DOCUMENTS

| | | |
|---|---|---|
| JP | 2005 099410 A | 4/2005 |
| JP | 2007-27693 A | 2/2007 |
| JP | 2008-545999 A | 12/2008 |
| KR | 100763493 B1 | 10/2007 |
| KR | 100787237 B1 | 12/2007 |
| KR | 100873516 B1 | 12/2008 |
| KR | 101240319 B1 | 3/2013 |
| KR | 101488419 B1 | 2/2015 |
| WO | WO-2005/088704 A1 | 9/2005 |
| WO | WO-2007/037106 A1 | 4/2007 |
| WO | WO-2008/103931 A2 | 8/2008 |
| WO | WO-2008/143635 A1 | 11/2008 |
| WO | WO-2011/126726 A1 | 10/2011 |
| WO | WO-2016/012409 A2 | 1/2016 |

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Fan, Z. et al., Large-Scale, Heterogeneous Integration of Nanowire Arrays for Image Sensor Circuitry, PNAS, 105(32):11066-11070 (2008).

Feng, X. et al., Competing Fracture in Kinetically Controlled Transfer Printing, Langmuir, 23(25):12555-12560, (2007).

Foest. R. et al., Kalte Normaldruck-Jetplasmen zur lokalen Oberflächenbehandlung, Vakuum in Forschung and Praxis, 21(6):17-21, (2009).

Gent, A.N., Adhesion and Strength of Viscoelastic Solids. Is There a Relationship between Adhesion and Bulk Properties?, American Chemical Society, Langmuir, 12(19):4492-4496, (1996).

Hamer et al., 63.2: AMOLED Displays Using Transfer-Printed Integrated Circuits, SID 09 Digest, 40(2):947-950 (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Huang, Y. Y. et al., Stamp Collapse in Soft Lithography, Langmuir, 21(17):8058-8068, (2005).

Hui, C. Y. et al., Constraints on Microcontact Printing Imposed by Stamp Deformation, Langmuir, 18:1394-1407 (2002).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Lees, A. D. et al., The Organs of Adhesion in the Aphid Megoura Viciae, J. exp. Biol., 136:209-228 (1988).

Meitl, M. A. et al., Transfer printing by kinetic control of adhesion to an elastomeric stamp, Nature Material, 5:33-38, (2006).

Michel. B. et al., Printing meets lithography: Soft approaches to high-resolution patterning, J. Res. & Dev. 45(5):697-708, (2001).

Roscher, H., VCSEL Arrays with Redundant Pixel Designs for 10Gbits/s 2-D Space-Parallel MMF Transmission, Annual Report. optoelectronics Department, (2005).

Trindade, A.J. et al., Precision transfer printing of ultra-thin AlInGaN micron-size light-emitting diodes, Crown, pp. 217-218, (2012).

(56) References Cited

OTHER PUBLICATIONS

Wu-Bavouzet, F. et al., Effect of surface pattern on the adhesive friction of elastomers. Physical Review E, 82(3):031806-1-031806-9 (2010).

Yaniv et al., A 640 x 480 Pixel Computer Display Using Pin Diodes with Device Redundancy, 1988 International Display Research Conference, IEEE, CH-2678-1/88:152-154 (1988).

Yu, J. and Bulovic, V., Micropatterning metal electrode of organic light emitting devices using rapid polydimethylsiloxane lift-off, Applied Physics Letters, 91:043102-1-043102-3 (2007).

Zhou, W. et al., Mechanism for stamp collapse in soft lithography, Applied Physics Letters, 87:251925-1 (2005).

Bietsch, A. and Michel, B., Conformal contact and pattern stability of stamps used for soft lithography, J. Appl. Phys., 88(7):4310-4318, (2000).

Schmid, H. and Michel, B., Siloxane Polymers for High-Resolution, High-Accuracy Soft Lithography, Macromolecules 2000, 33:3042-3049, (2000).

Bower, C. A. et al., Micro-Transfer-Printing: Heterogeneous Integration of Microscale Semiconductor Devises using Elastomer Stamps, IEEE Conference, (2014).

\* cited by examiner

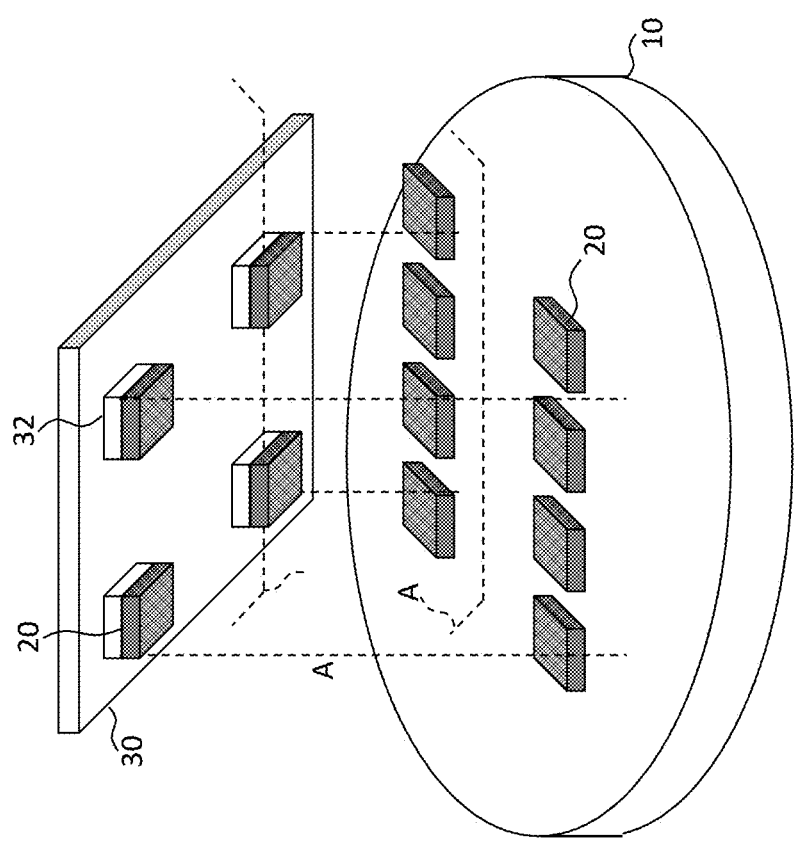

PRINTING COMPONENT ARRAYS WITH DIFFERENT ORIENTATIONS

TECHNICAL FIELD

The present disclosure relates generally to structures and methods for transferring (e.g., micro-transfer printing) multiple arrays of micro-components onto a substrate.

BACKGROUND

Substrates with electronically active components distributed over the extent of the substrate may be used in a variety of electronic systems, for example, in flat-panel display devices such as flat-panel liquid crystal or organic light emitting diode (OLED) displays, in imaging sensors, and in flat-panel solar cells. The electronically active components are typically either assembled on the substrate, for example using individually packaged surface-mount integrated-circuit devices and pick-and-place tools, or by sputtering or spin coating a layer of semiconductor material on the substrate and then photolithographically processing the semiconductor material to form thin-film circuits on the substrate. Individually packaged integrated-circuit devices typically have smaller transistors with higher performance than thin-film circuits but the packages are larger than can be desired for highly integrated systems.

Methods for transferring active components from one substrate to another are described in U.S. Pat. No. 7,943,491. In examples of these approaches, small integrated circuits are formed on a native semiconductor source wafer. The small unpackaged integrated circuits, or chiplets, are released from the native source wafer by etching a layer formed beneath the circuits. A PDMS stamp is pressed against the native source wafer and the process side of the chiplets is adhered to individual stamp posts. The chiplets are pressed against a destination substrate or backplane with the stamp and adhered to the destination substrate. In other examples, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In order to populate a large destination substrate with components from a native source wafer, the stamp repeatedly picks up components from different locations on the native source wafer with stamp posts and prints the components to different locations on the destination substrate. The arrangement of components on the destination substrate is at least partly defined by the arrangement of the components on the native source wafer and the arrangement of posts on the stamp. The location of the stamp with respect to the native source wafer and the destination substrate is controlled by an opto-electro-mechanical control system.

SUMMARY

It has been found that because of variation in materials and photolithographic processes on the native source wafer, the performance or other attributes of components formed on a native source wafer can also vary. This variation in source materials can cause operational non-uniformities in components transferred to the destination substrate. There is a need, therefore, for systems, structures, devices, materials, and methods that reduce variability in arrangements of multiple arrays of micro-transfer-printed micro-components on destination substrates. The present disclosure provides, inter alia, structures, materials, and methods that provide reduced large-scale component variation on a substrate.

In accordance with certain embodiments of the present disclosure, a method of micro-transfer printing comprises providing a component source wafer and components disposed in, on, or over the component source wafer, providing a destination substrate, and providing a stamp for transferring the components from the component source wafer to the destination substrate, wherein the component source wafer has an attribute or structure that varies across the component source wafer such that different ones of the components in different locations have a different structure, operation, appearance, or performance of the components, transferring a first array of components from the component source wafer to the destination substrate with a first orientation, and transferring a second array of components from the component source wafer to the destination substrate with a second orientation, wherein the second orientation is different from the first orientation.

In some embodiments, methods of the present invention comprise transferring the first array and transferring the second array with micro-transfer printing (e.g., dry contact printing).

In some embodiments of the present invention, the second orientation is rotated relative to the first array to provide different first and second orientations. The second orientation can be rotated 90 degrees, 180 degrees, or 270 degrees with respect to the first orientation.

In some embodiments, methods of the present invention comprise transferring the second array of components adjacent to the first array of components on the destination substrate. In some embodiments, methods of the present invention comprise repeatedly transferring arrays of components from the component source wafer to the destination substrate with adjacent arrays on the destination substrate transferred at different orientations. In some embodiments, methods of the present invention comprise repeatedly transferring arrays of components from the component source wafer to the destination substrate N times in one dimension, where N/2 pairs of adjacent arrays on the destination substrate comprise array i and array (N−1−i) for each i from 0 to (N/2)−1. In some embodiments, methods of the present invention comprise repeatedly transferring arrays of components from the component source wafer to the destination substrate N×M times in two dimensions, where N/2×M/2 two-by-two adjacent component arrays on the destination substrate comprise array (i, j), array (N−1−i, j), array (i, M−1−j), and array (N−1−i, M−1−j) for each i from 0 to (N/2)−1 and each j from 0 to (M/2)−1.

In some embodiments, methods of the present invention comprise interlacing the second array with respect to the first array in at least one dimension to provide different first and second orientations. The interlacing can be in one dimension or in two dimensions. The first array and the second array can each be regular, arrangements of components in one dimension or regular arrangements of components in two dimensions.

In some embodiments, methods of the present invention comprise offsetting the second array with respect to the first array on the destination substrate by an amount that is different from an offset of the first array with respect to the second array on the component source wafer to provide different first and second orientations. The second array can be disposed with respect to the first array on the destination substrate in a different direction than the second array is disposed with respect to the first array on the component source wafer. The first array and second array can be adjacent on the component source wafer before transferring but not adjacent on the destination substrate after transferring.

In some embodiments, methods of the present invention comprise providing a plurality of component source wafers, wherein the plurality of component source wafers comprises the component source wafer, and transferring arrays of components from each of the component source wafers onto the destination substrate with two or more different orientations.

In some embodiments of the present invention, the plurality of component source wafers comprises a first component source wafer and a second component source wafer different from the first component source wafer, and some methods of the present invention comprise interlacing components from the first component source wafer between components from the second component source wafer.

In some embodiments of the present invention, the components are light-emitting components such as inorganic light-emitting diodes.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 12A is a perspective and FIG. 12B is a schematic cross section taken along cross section line A of FIG. 12A of the stamp with the second subset of components removed from the component source wafer according to illustrative embodiments of the present disclosure;

Figure 1:
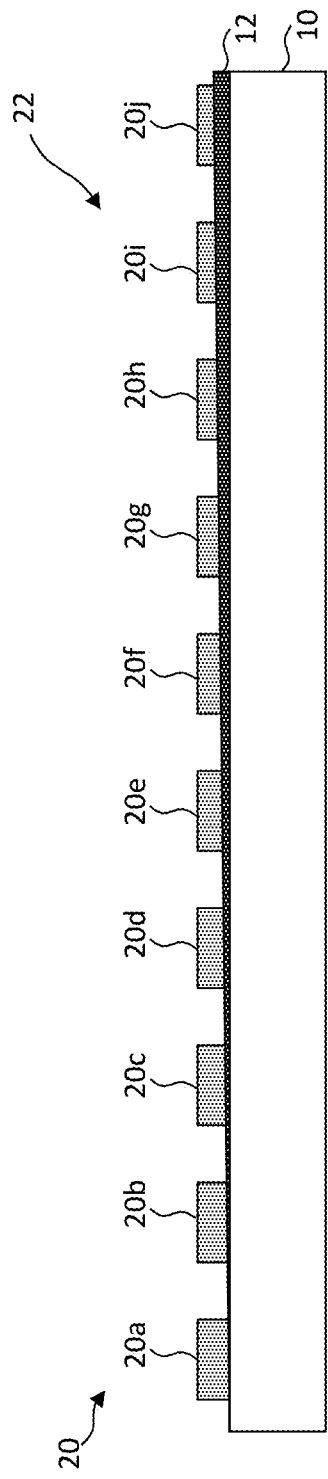
FIG. 1 is a schematic cross section of a native source wafer comprising an array of components useful in understanding embodiments of the present disclosure.

The perspectives shown in FIGS. 4A, 6A, 7A, 9A, 10A, 12A, 13A, 15A, and 16-23 are exploded illustrations with exaggerated viewing angles and the two cross section lines A indicated in some of the perspective Figures are actually congruent.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward methods of micro-transfer printing arrays of components from a component source wafer to a destination substrate using a stamp, wherein an attribute or structure of the components varies systematically over the component source wafer so that different ones of the components in different locations on the component source wafer have a different structure, operation, appearance, or performance. The attribute variation can, in the absence of structures, devices, systems, and methods of the present disclosure, result in unwanted large-scale non-uniformity in component operation, structure, or appearance on the destination substrate. According to some embodiments of the present disclosure, the large-scale operation can be mitigated by providing components on a destination substrate at different orientations with respect to the attribute variation on a component source wafer. The components can be provided in arrays so that a first array is disposed with a first orientation and a second array is disposed with a second orientation, where the second orientation is different from the first orientation. Different orientations can, for example, comprise different spatial rotations, offsets, interlacings (e.g., interdigitations), or interlacing in one or two directions (dimensions) in which the attribute varies. Arrays of components 20 can be for example regular one-dimensional arrays or regular two-dimensional arrays.

FIG. 1 is a cross section of a component source wafer 10 comprising an array 22 of components 20 (e.g., 20a-20j). Components 20 can be native to component source wafer 10, that is components 20 can be constructed on, in, or over component source wafer 10 using, for example, photolithographic materials and methods useful for integrated circuit technology. Any manufacturing process experiences variation in materials and process control that can result in variation in native component source wafers 10. According to some embodiments, a plurality of components 20 (e.g., components 20a-20j) are disposed in, on, or over component source wafer 10. In some embodiments, component source wafer 10 has an attribute or structure 12 that varies across component source wafer 10 (e.g., across a surface of component source wafer 10) that affects the structure, operation, appearance, or performance of components 20. The variation can be, but is not necessarily, monotonic with respect to one or more directions (e.g., orthogonal directions) over a component source wafer. For simplicity in explanation and to aid understanding, an attribute or structure 12 is referred to herein as an attribute 12. For example, attribute 12 can be an epitaxial layer whose thickness (as shown in FIG. 1), material purity, doping, or crystallinity varies across component source wafer 10. Attribute 12 can be particle contamination or any other variable attribute or structure 12 of component source wafer 10 that affects the structure, operation, or performance of components 20. The variation of attribute 12 can be linear (or non-linear) in one or two dimensions over component source wafer 10 or a surface of component source wafer 10. The variation of an attribute 12 can be spatially monotonic, so that attribute 12 is always increasing (or decreasing) in one or more directions either across the entire component source wafer 10 or portions of component source wafer 10 much larger than an extent or size of a component 20, for example the spatial extent of 10, 100, or 1000 components 20 over component source wafer 10 in one or two directions, or can be otherwise systematic, for example repetitive. Components 20 can be provided in an array 22, for example a regular array, in one or two dimensions over component source wafer 10 or a surface of component source wafer 10.

Figure 2:
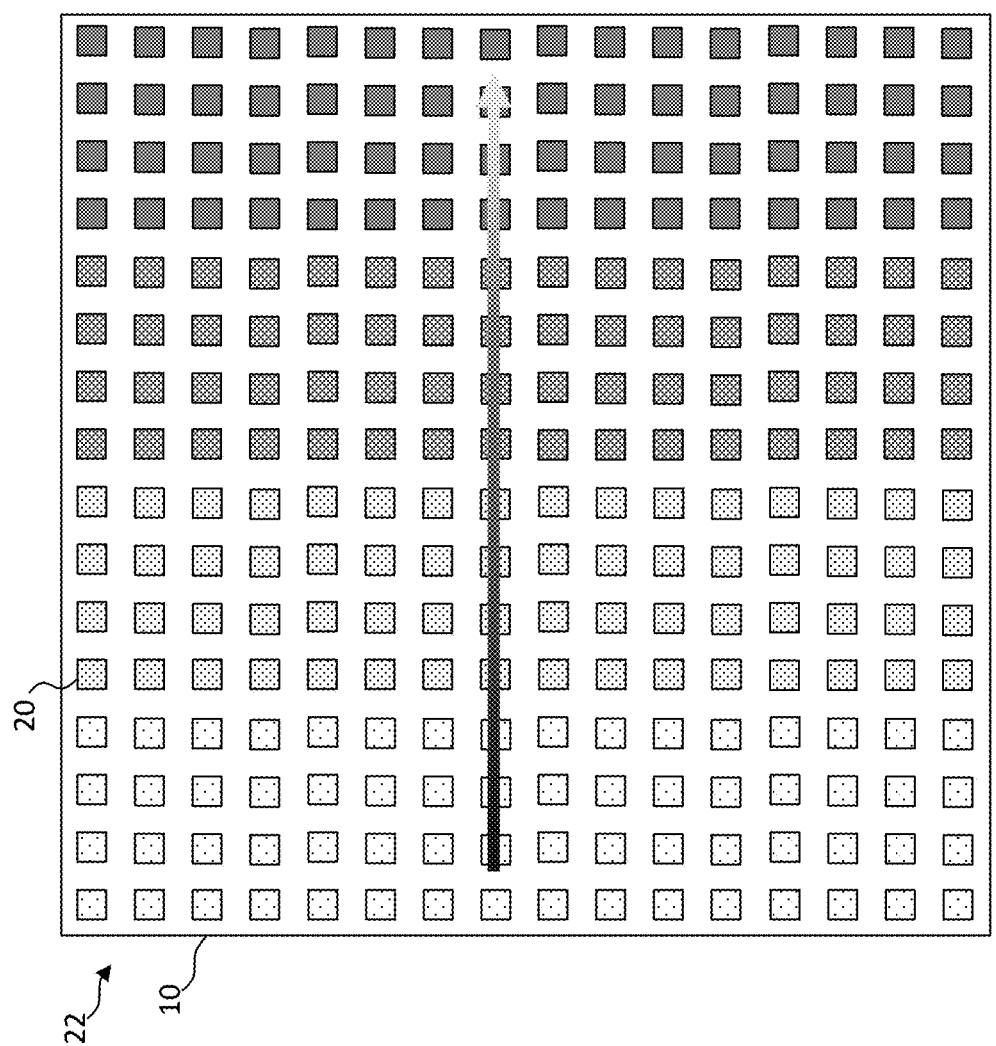
FIG. 2 is a schematic plan view of a native source wafer comprising an array of components having a common variable attribute that varies in one dimension across the array useful in understanding embodiments of the present disclosure.
Figure 3:
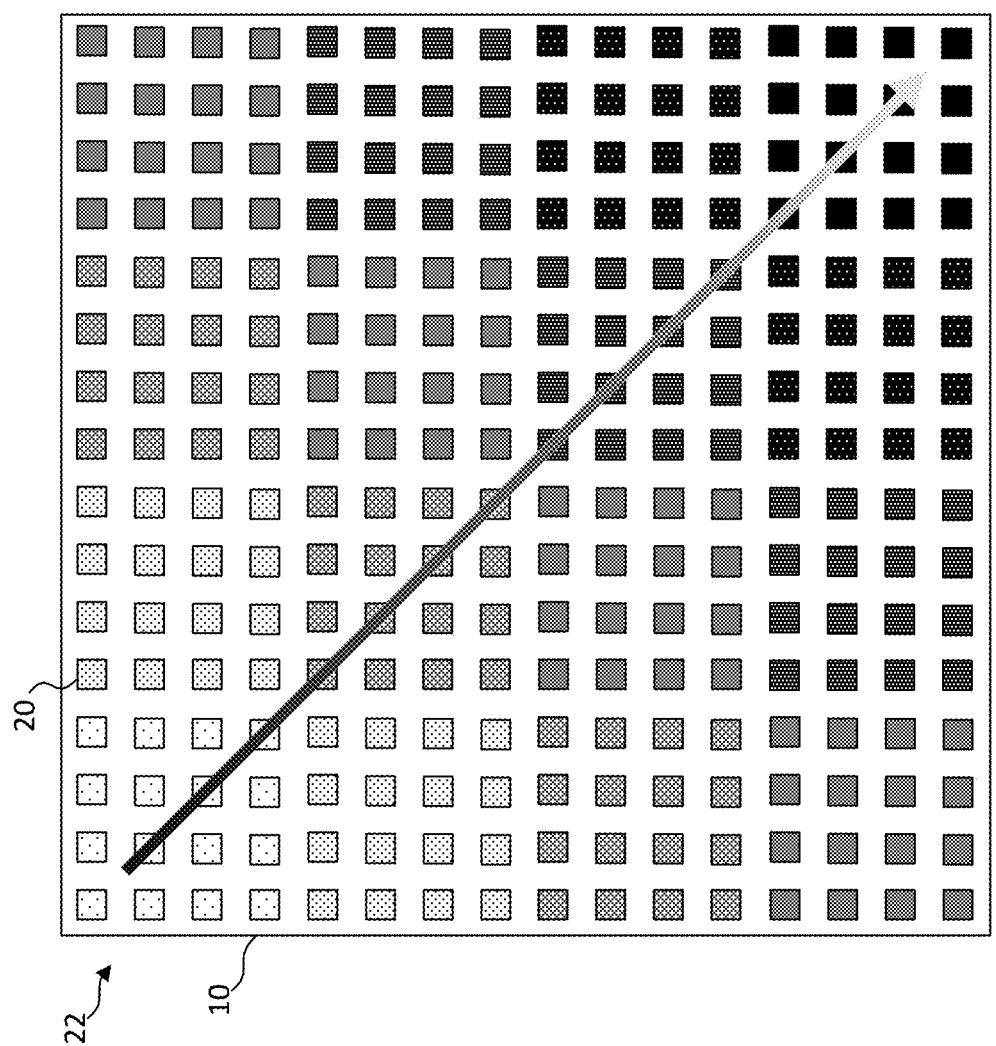
FIG. 3 is a schematic plan view of a native source wafer comprising an array of components having a common variable attribute that varies in two dimensions across the array useful in understanding embodiments of the present disclosure.

FIGS. 2 and 3 illustrate an array 22 of components 20 distributed regularly in two dimensions over a component source wafer 10, for example a rectangular portion of component source wafer 10. A variation of an attribute 12 is visually represented by the shading of component 20. A darker shading implies a greater amount or quantity of attribute 12, for example a greater epitaxial layer thickness. The shading of component 20 is merely illustrative of the variation of attribute 12 and does not imply that components 20 vary in color or appearance. By shading the illustration of component source wafer 10 in the figures, the variation in structure, operation, appearance, or performance of components 20 is visually apparent in the figures and is more readily understood. As shown in FIG. 2, the quantity of attribute 12 increases in one direction (e.g., horizontally), as shown by the arrow. Referring to FIG. 3, the quantity of attribute 12 increases in two directions (e.g., both horizontally and vertically), as shown by the arrow.

Figure 4A:
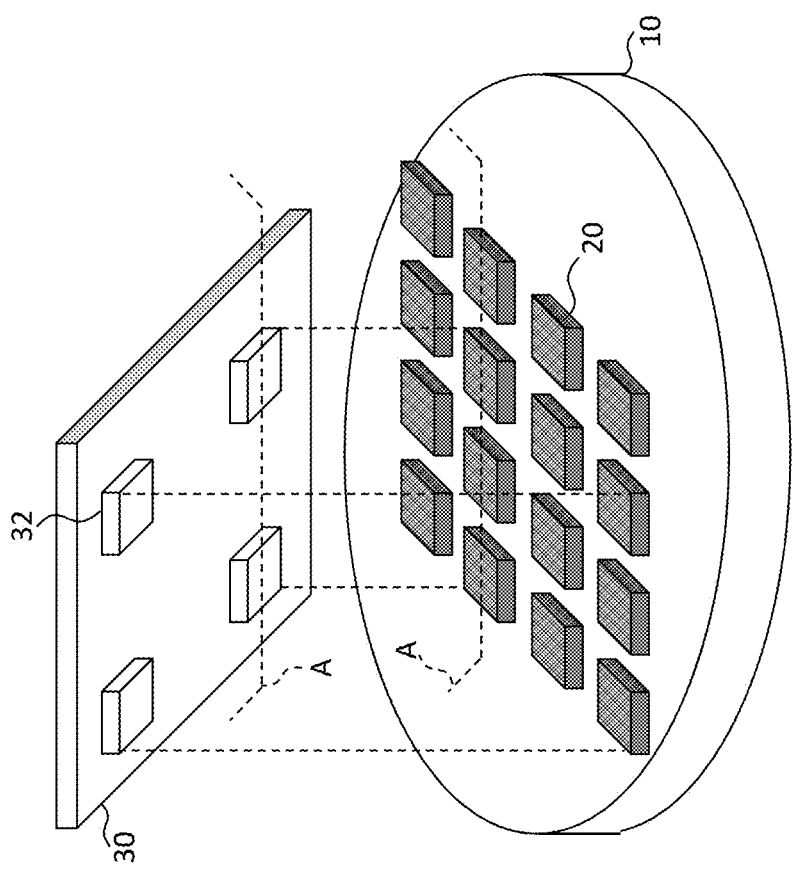
FIG. 4A is a perspective and FIG. 4B is a schematic cross section taken along cross section line A of FIG. 4A of a stamp and component source wafer according to illustrative embodiments of the present disclosure.
Figure 4B:
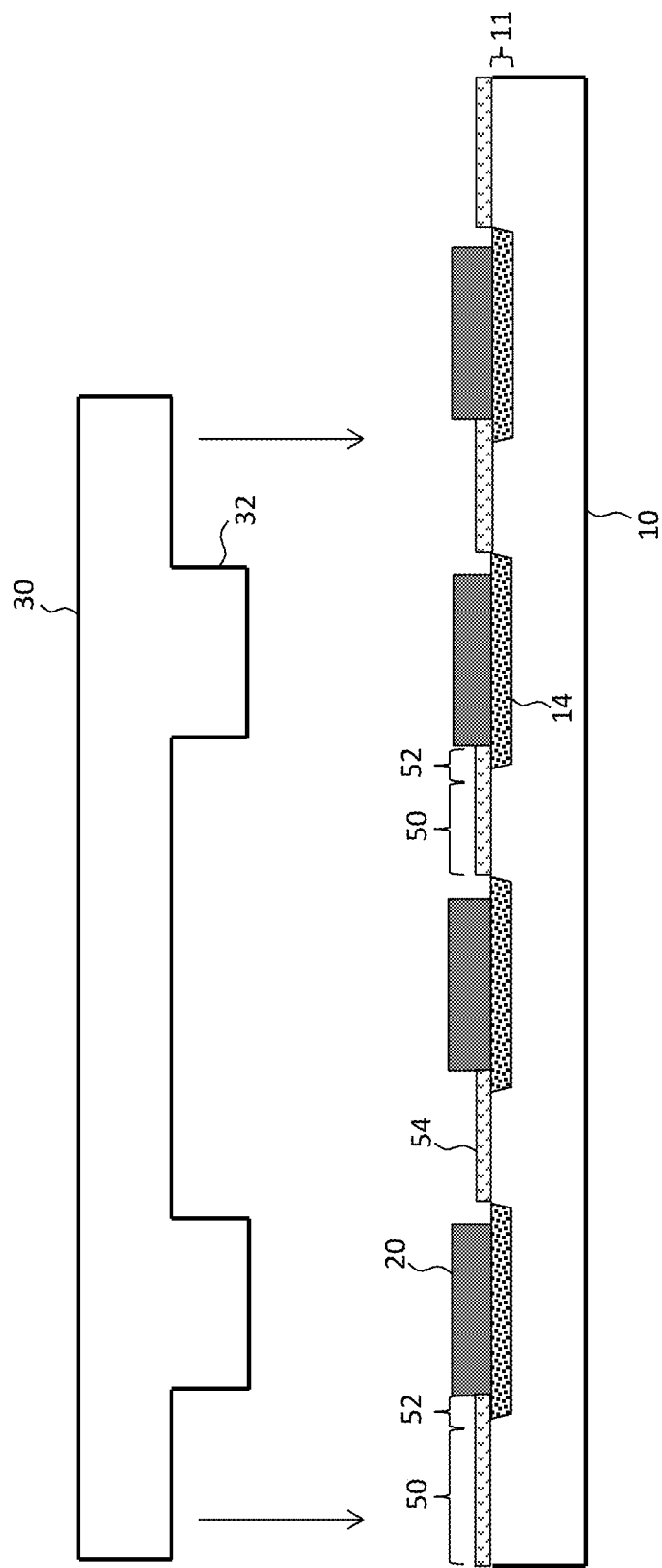
Figure 23:
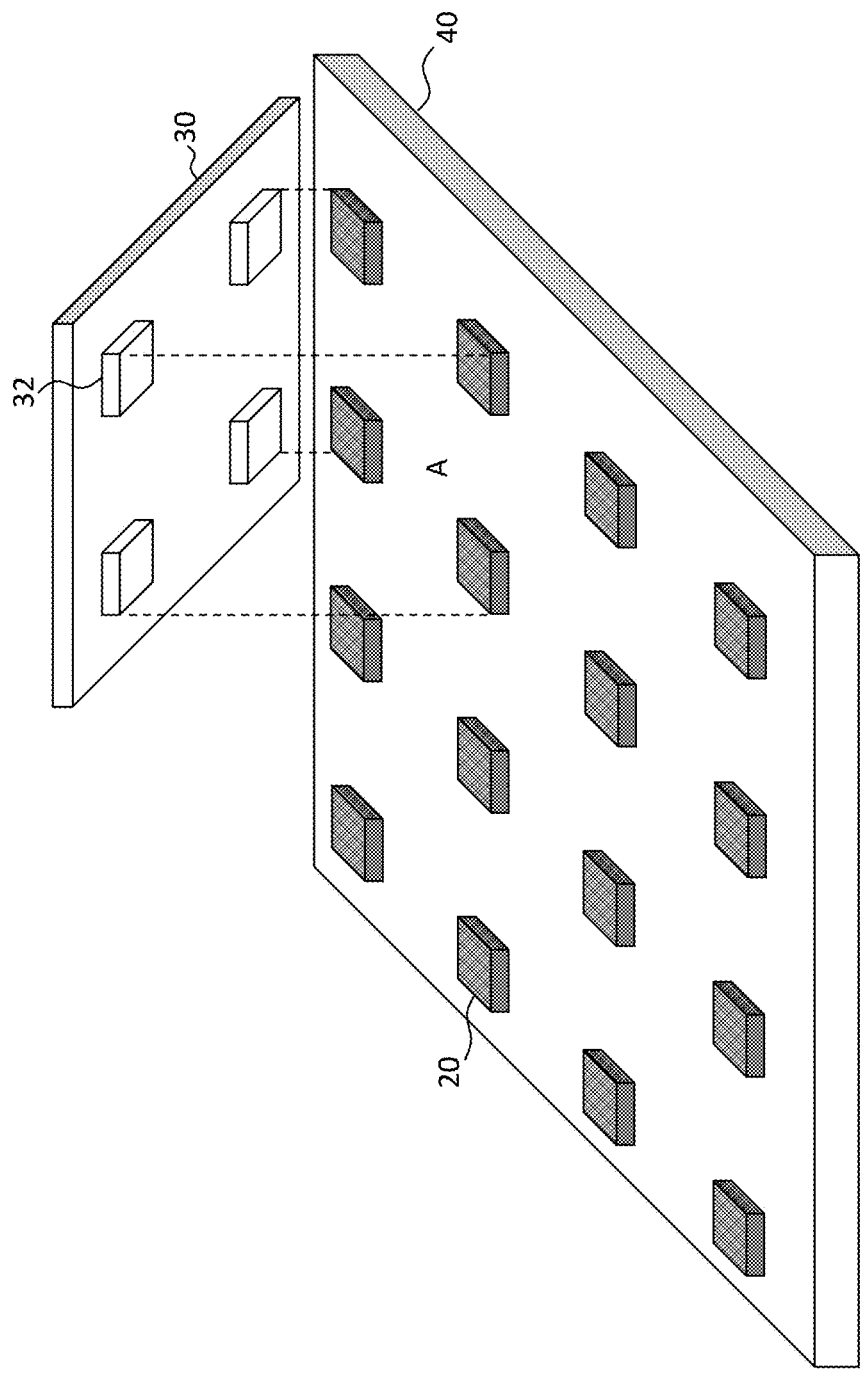
FIG. 23 is a perspective of the stamp after micro-transfer printing the fourth subset of components from the stamp to the destination substrate in a rotated configuration according to illustrative embodiments of the present disclosure.
Figure 24:
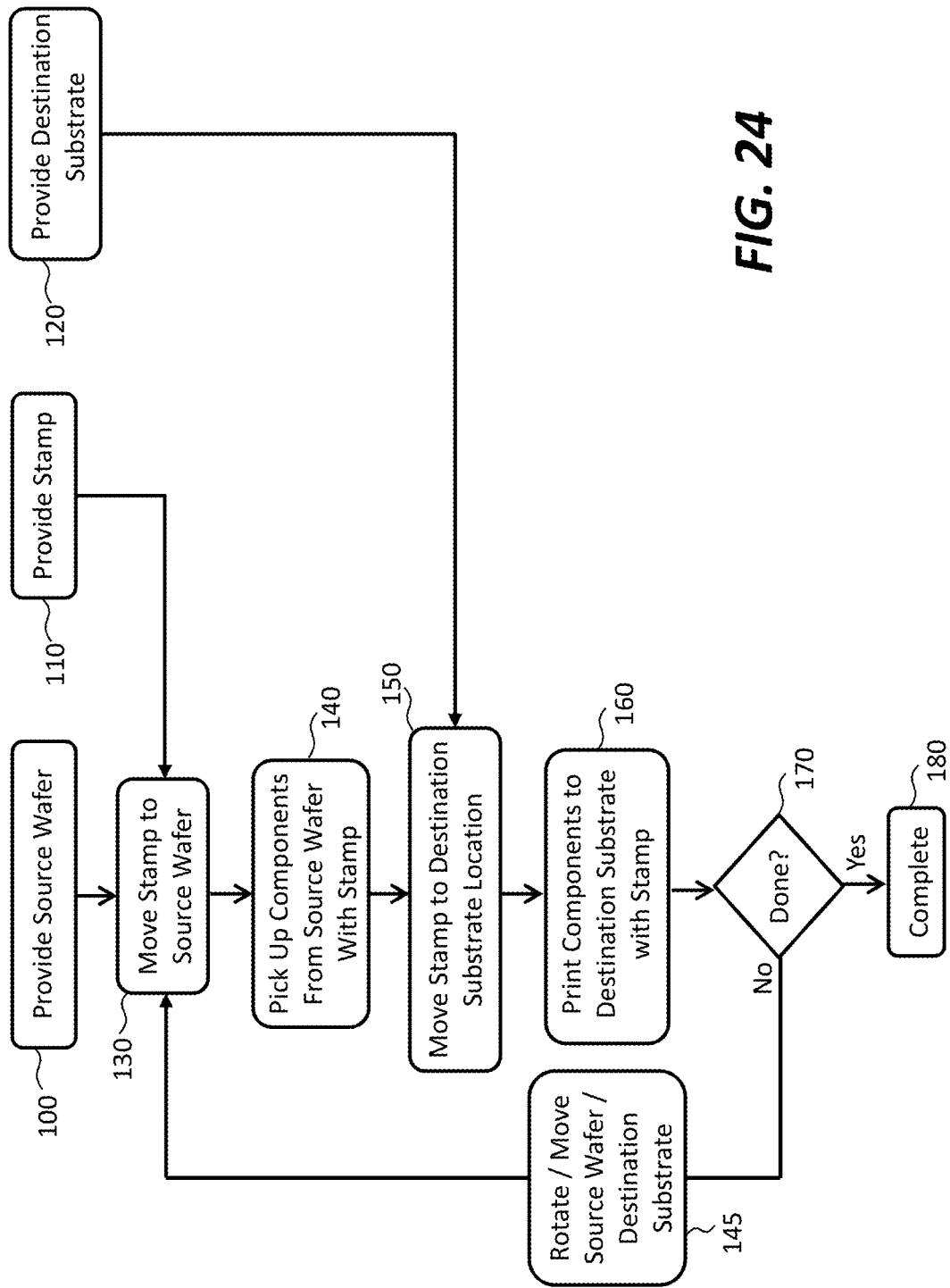
FIG. 24 is a flow diagram according to illustrative embodiments of the present disclosure.

Referring to the sequential cross sections and perspectives of FIGS. 4A-23 and the flow diagram of FIG. 24, according to embodiments of the present disclosure, a method of micro-transfer printing comprises providing a component source wafer 10 comprising components 20 in step 100 and providing a stamp 30 in step 110 (as shown in the exploded FIG. 4A perspective and corresponding cross section FIG. 4B taken along cross section line A of FIG. 4A). Stamp 30 can, but does not necessarily, comprise stamp posts 32 each with a stamp post area on a distal end of stamp posts 32. The stamp posts 32 protrude from stamp 30 to contact components 20 when stamp 30 is pressed against components 20. As shown in FIG. 4B, components 20 are entirely disposed over, and can be formed on (e.g., in direct contact with), sacrificial portions 14 spatially separated by anchors 50 in sacrificial layer 11 of component source wafer 10. Sacrificial layer 11 can be a patterned sacrificial layer 11. Components 20 can be, but are not necessarily, arranged in a rectangular array 22, for example in a regular two-dimensional arrangement, as shown in FIG. 4A. A dielectric layer 54 disposed over destination substrate 40 and sacrificial portions 14 connects each component 20 with a component tether 52 to an anchor 50. Component tethers 52 are not necessarily made from a dielectric or in a dielectric layer. Component tethers 52 can be laterally connected to anchors 50 (as shown) or disposed in other locations, for example beneath components 20.

Figure 5:
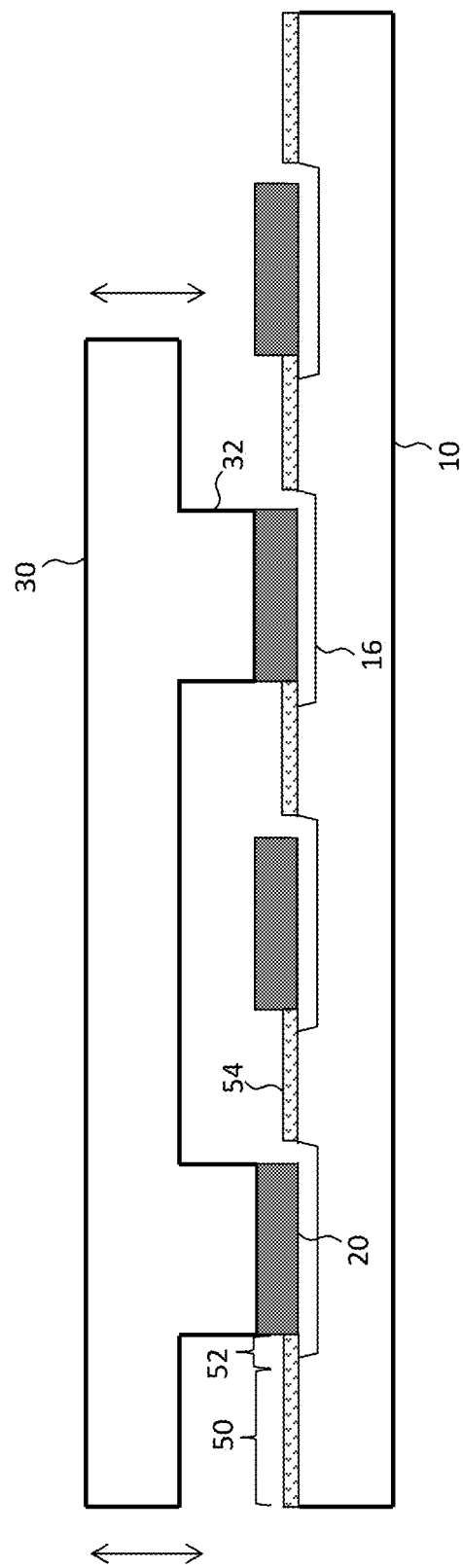
FIG. 5 is a schematic cross section of the stamp in contact with a first subset of components on the component source wafer according to illustrative embodiments of the present disclosure.

Referring to FIG. 5, sacrificial portions 14 (shown in FIG. 4B) are sacrificed, for example by etching sacrificial portions 14 to form gaps 16, so that components 20 are suspended over gaps 16 and attached to anchors 50 of component source wafer 10 by component tethers 52 that maintain the physical position of components 20 with respect to component source wafer 10 after sacrificial portions 14 are etched. In some embodiments, each component is attached to each of one or more anchors 50 by one or more component tethers 52. Stamp 30 is moved into position with respect to component source wafer 10, for example by an opto-mechatronic motion platform, in step 130 and components 20 are picked up from component source wafer 10 by adhering components 20 to stamp 30, for example by pressing stamp 30 against components 20 on component source wafer 10 with the motion platform and adhering components 20 to the distal ends of stamp posts 32, for example with van der Waals or electrostatic forces.

Figure 6A:
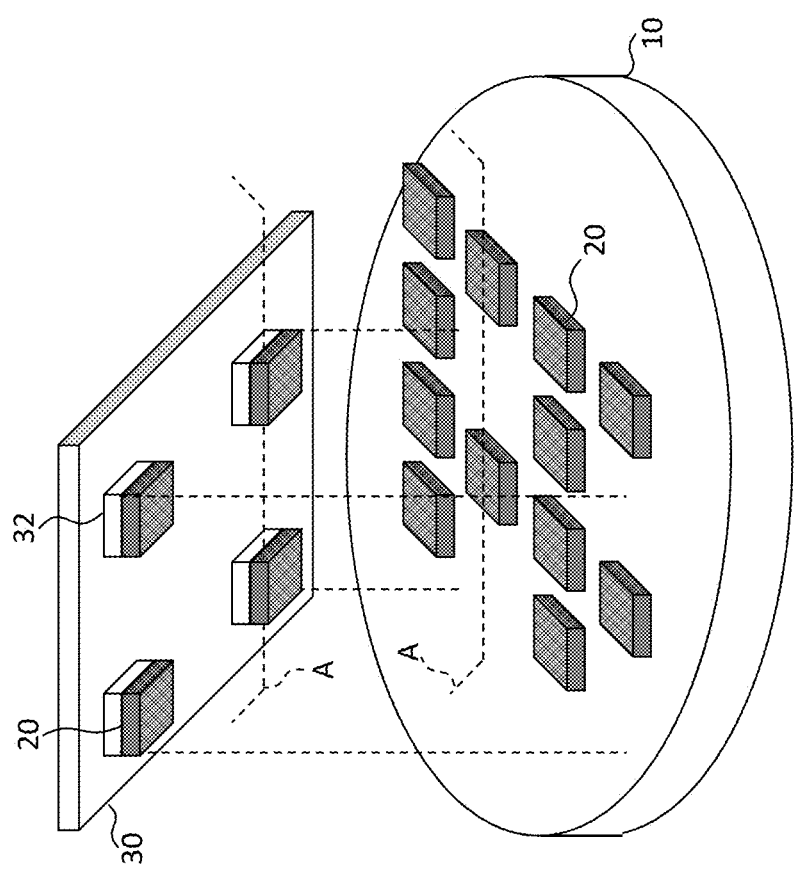
FIG. 6A is a perspective and FIG. 6B is a schematic cross section taken along cross section line A of FIG. 6A of the stamp with the first subset of components removed from the component source wafer according to illustrative embodiments of the present disclosure.
Figure 6B:
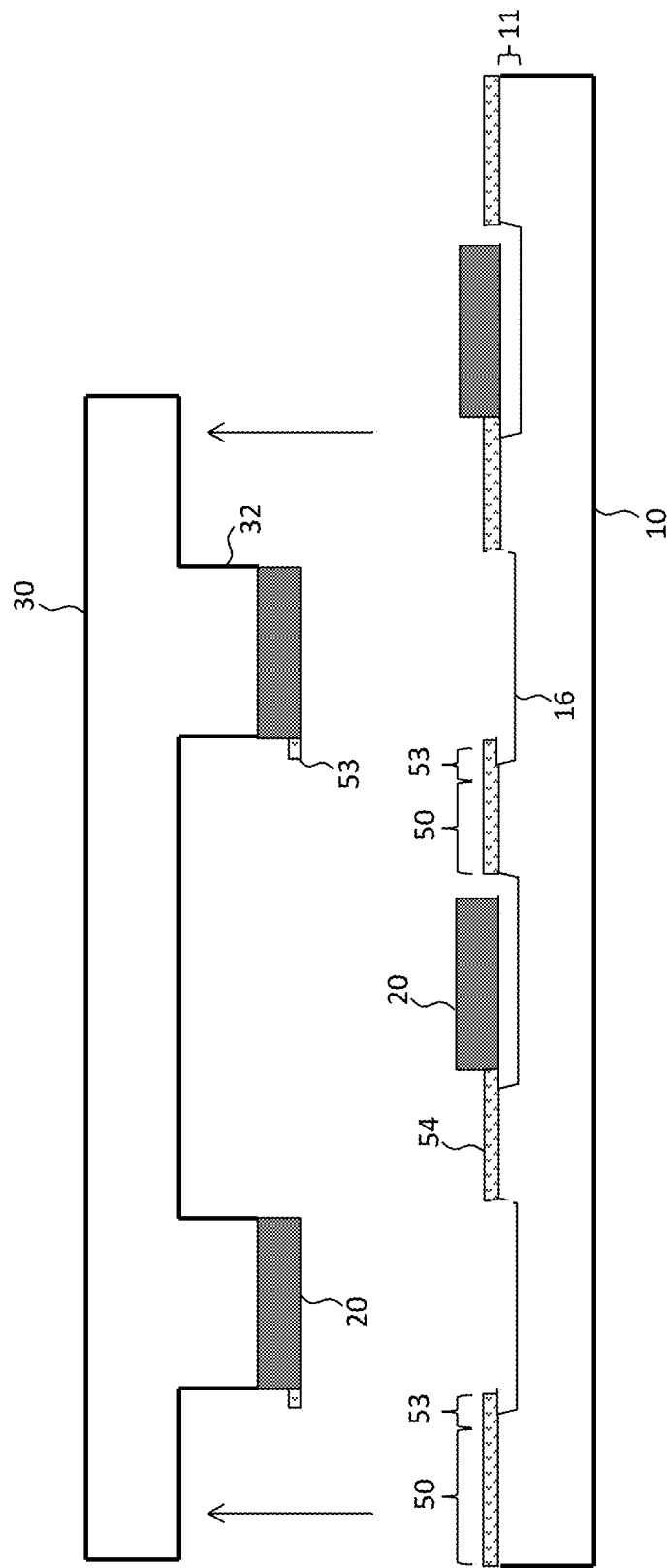

As shown in the FIG. 6A perspective and FIG. 6B cross section taken along cross section line A of FIG. 6A, stamp 30 in contact with components 20 suspended over gaps 16 is then removed from component source wafer 10 by the motion platform, fracturing component tethers 52 from anchors 50 to form separated or fractured component tethers 53 and picking up components 20 from component source wafer 10 with stamp 30 in step 140, providing picked-up stamp components 20. Picked-up stamp components 20 can comprise a separated or fractured component tether 53.

Figure 7A:
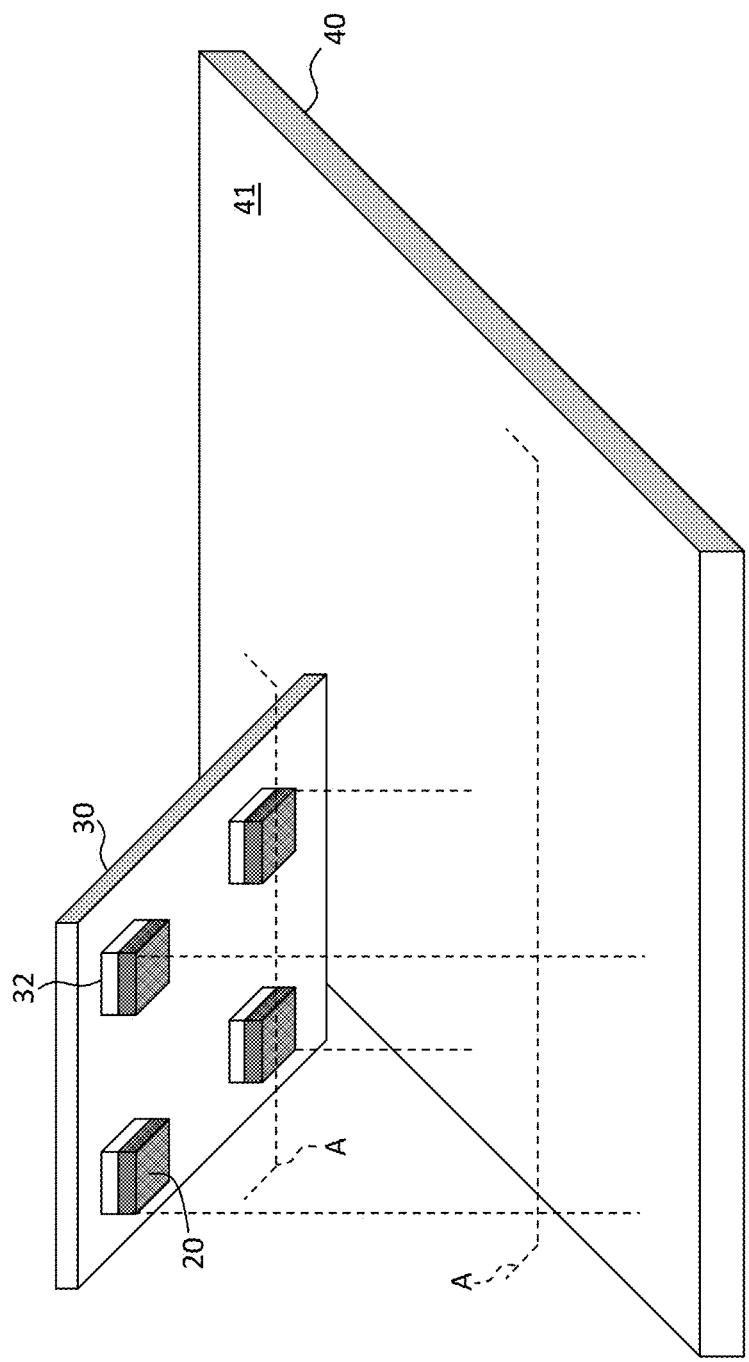
FIG. 7A is a perspective and FIG. 7B is a schematic cross section taken along cross section line A of FIG. 7A of the stamp before micro-transfer printing the first subset of components from the stamp to a destination substrate according to illustrative embodiments of the present disclosure.
Figure 7B:
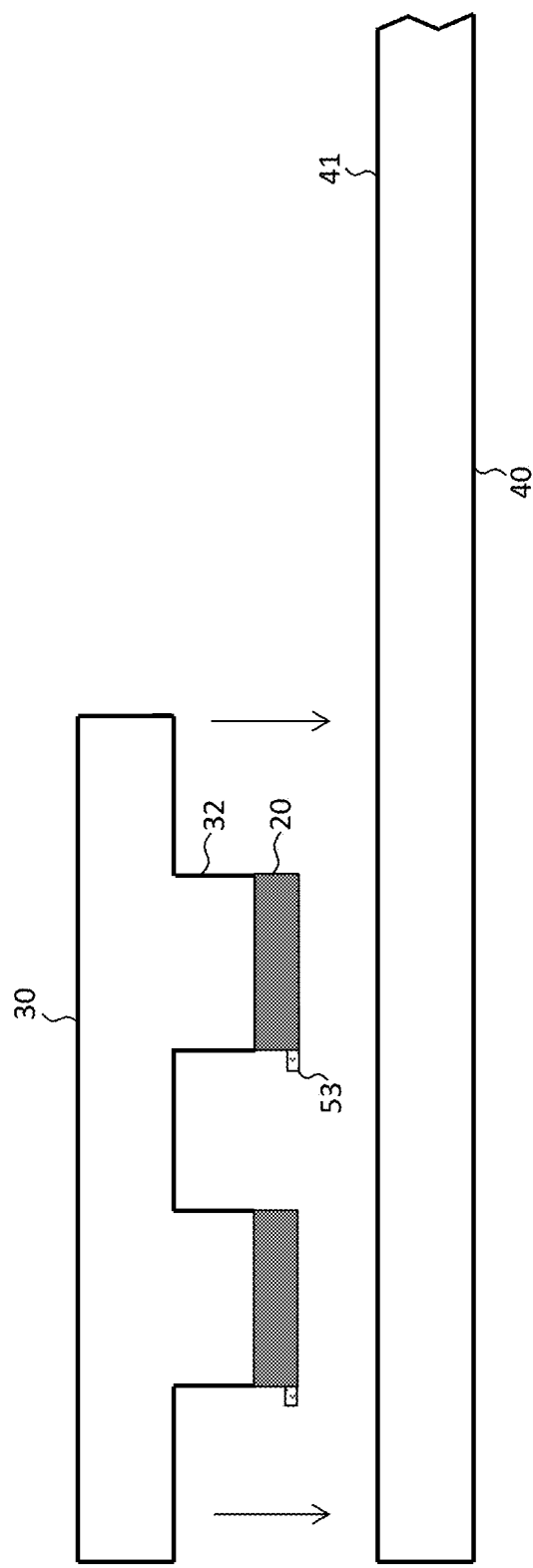

Referring to the perspective of FIG. 7A and cross section of FIG. 7B taken along cross section line A of FIG. 7A, a destination substrate 40 is provided in step 120. In step 150, stamp 30 and stamp components 20 with fractured component tethers 53 are moved into position and aligned with respect to destination substrate 40.

Figure 8:
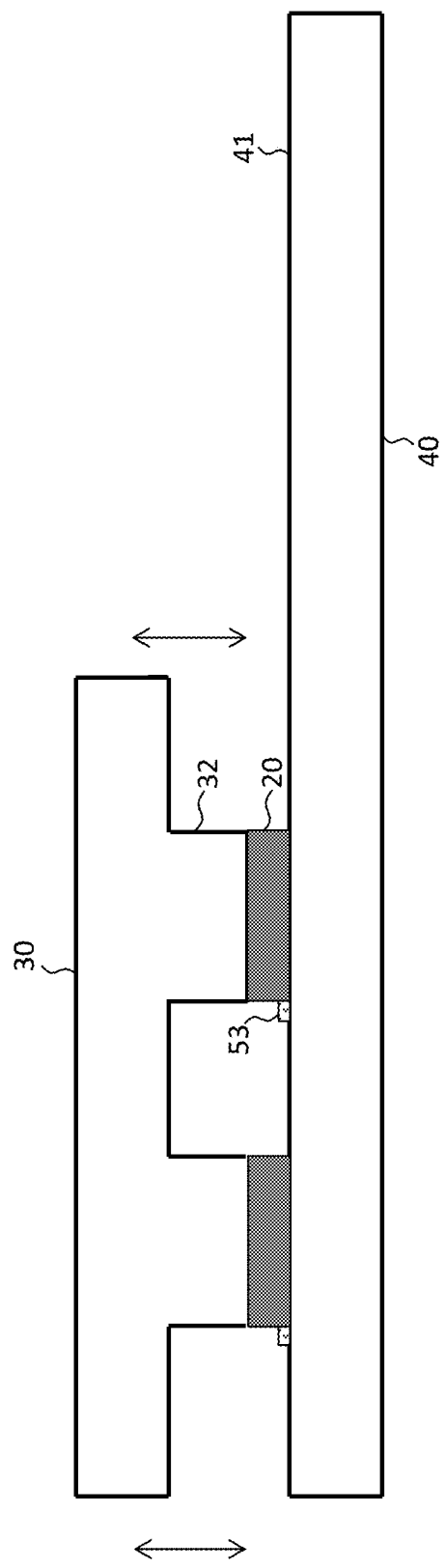
FIG. 8 is a schematic cross section of the stamp micro-transfer printing the first subset of components to the destination substrate according to illustrative embodiments of the present disclosure.
Figure 9A:
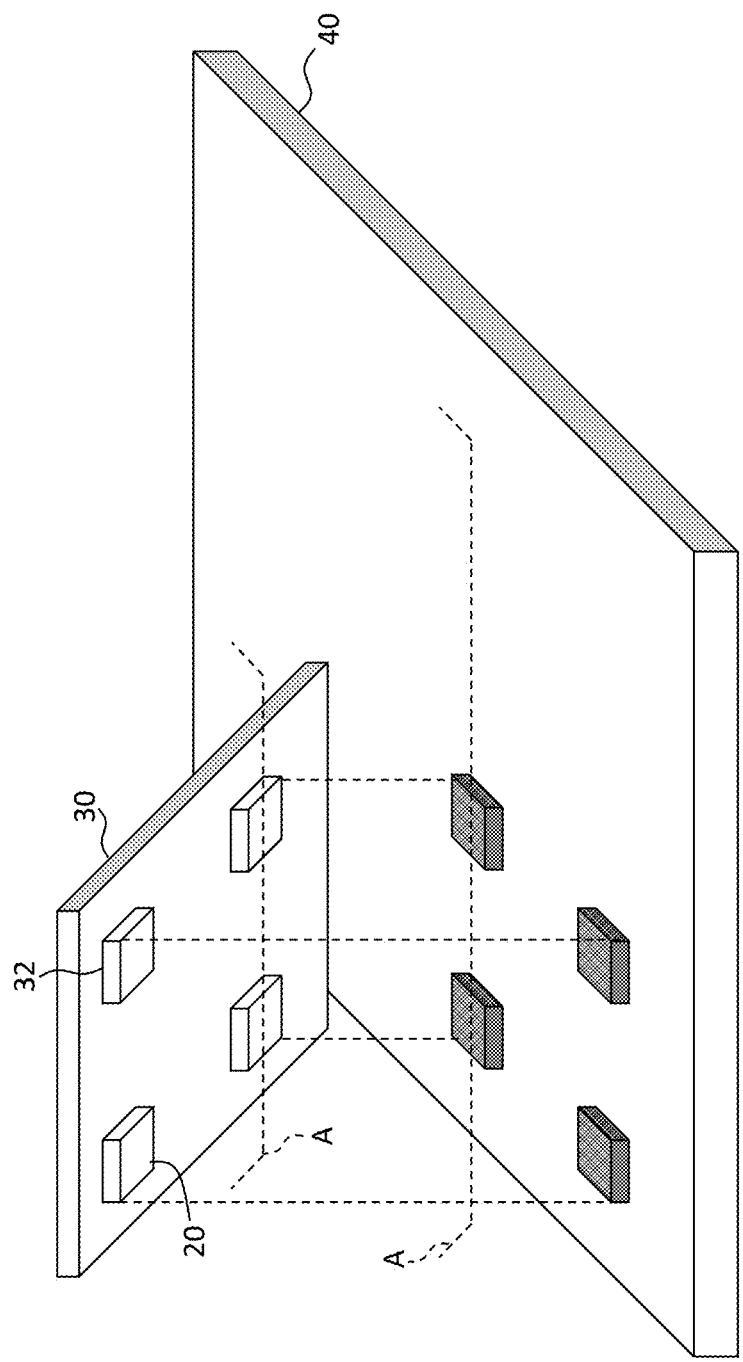
FIG. 9A is a perspective and FIG. 9B is a schematic cross section taken along cross section line A of FIG. 9A of the stamp and destination substrate after micro-transfer printing the first subset of components from the stamp to the destination substrate according to illustrative embodiments of the present disclosure.
Figure 9B:
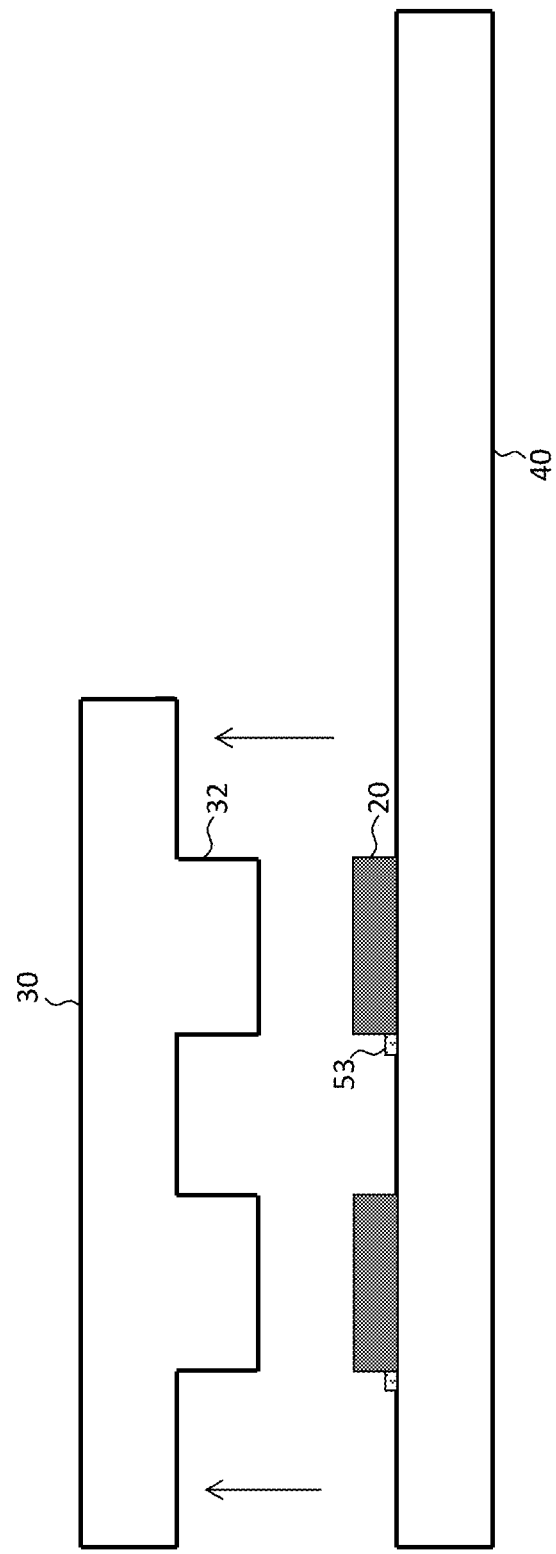

Referring to FIG. 8, in step 160 picked-up stamp components 20 with fractured component tethers 53 are micro-transfer printed to a surface of destination substrate 40 in step 160 and, referring to FIGS. 9A and 9B, stamp 30 is removed from destination substrate 40.

If the process is not completed (done step 170), the process of picking up components 20 from component source wafer 10 is repeated (steps 130 and 140), possibly more than once. However, for at least one of the repetitions, micro-transfer printed components 20 are disposed with an orientation different from the orientation of the first micro-transfer print step 160. The orientation for a component source wafer 10 is taken with respect to the direction in which attribute 12 varies, for example the direction of the arrow in FIGS. 2 and 3. In some embodiments, every print step 160 is performed with a different orientation than the first print step 160. In some embodiments, only one or only some of the repeated print steps 160 is performed with a different orientation. In some embodiments, every other, every third, or every fourth repeated print step 160 is performed with a different orientation. An orientation can be repeated for different print steps, for example two orientations can be alternately employed or multiple orientations (such as four orientations) can by cyclically employed.

Figure 26:
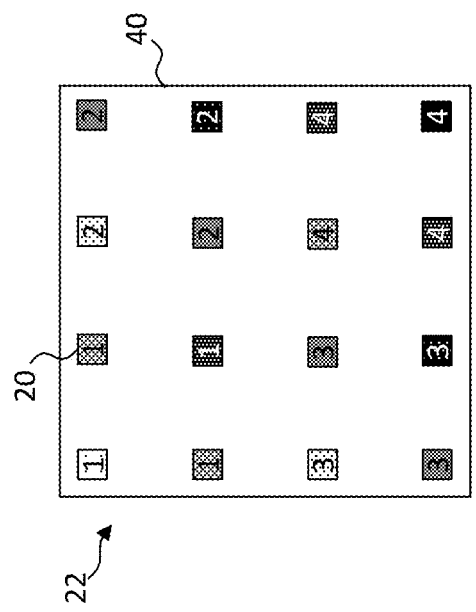
FIG. 26 is a plan view of a destination substrate with components printed according to the native source substrate and stamp pick-up method of FIG. 24 useful in understanding embodiments of the present disclosure.
Figure 31:
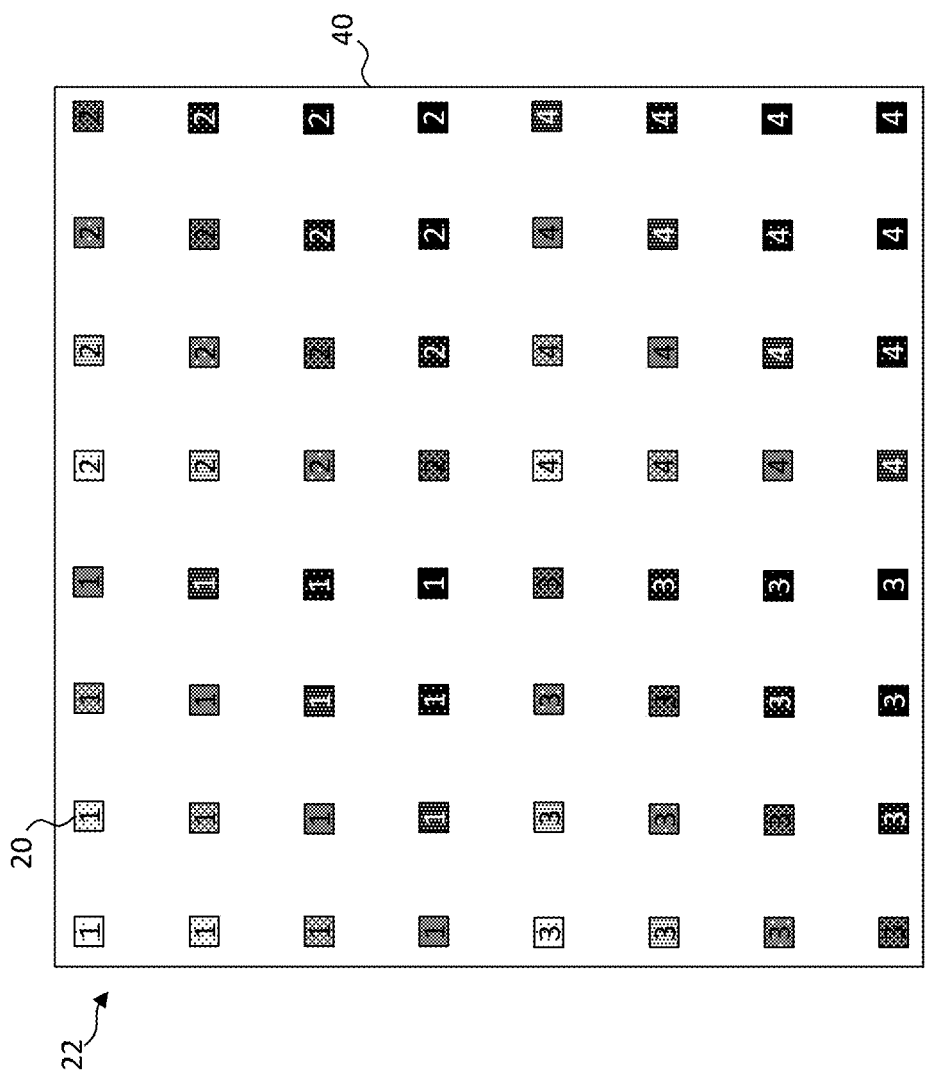
FIG. 31 is a plan view of a destination substrate with printed components from the native source substrate corresponding to FIG. 30 useful in understanding embodiments of the present disclosure.
Figure 32:
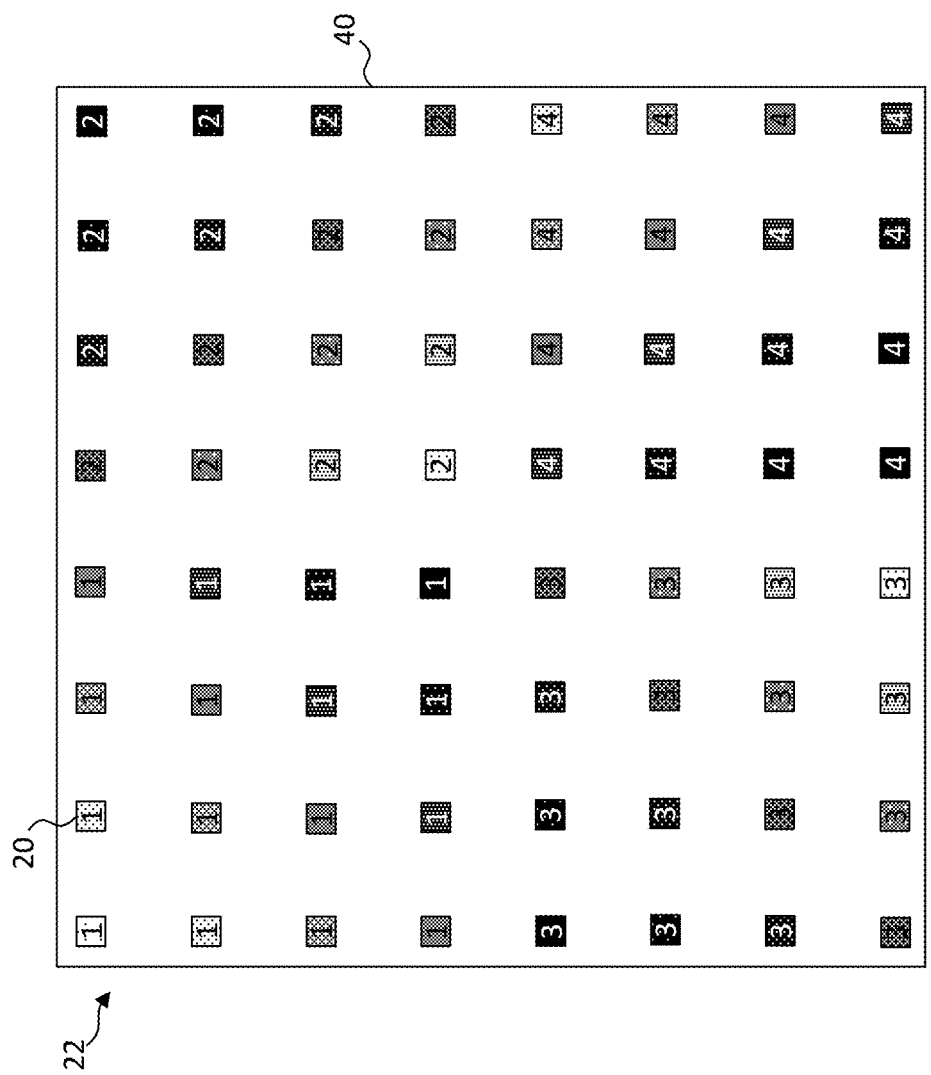
FIG. 32 is a plan view of a native source substrate with an 8×8 array of components labeled according to a stamp pick-up method according to illustrative embodiments of the present disclosure.
Figure 33:
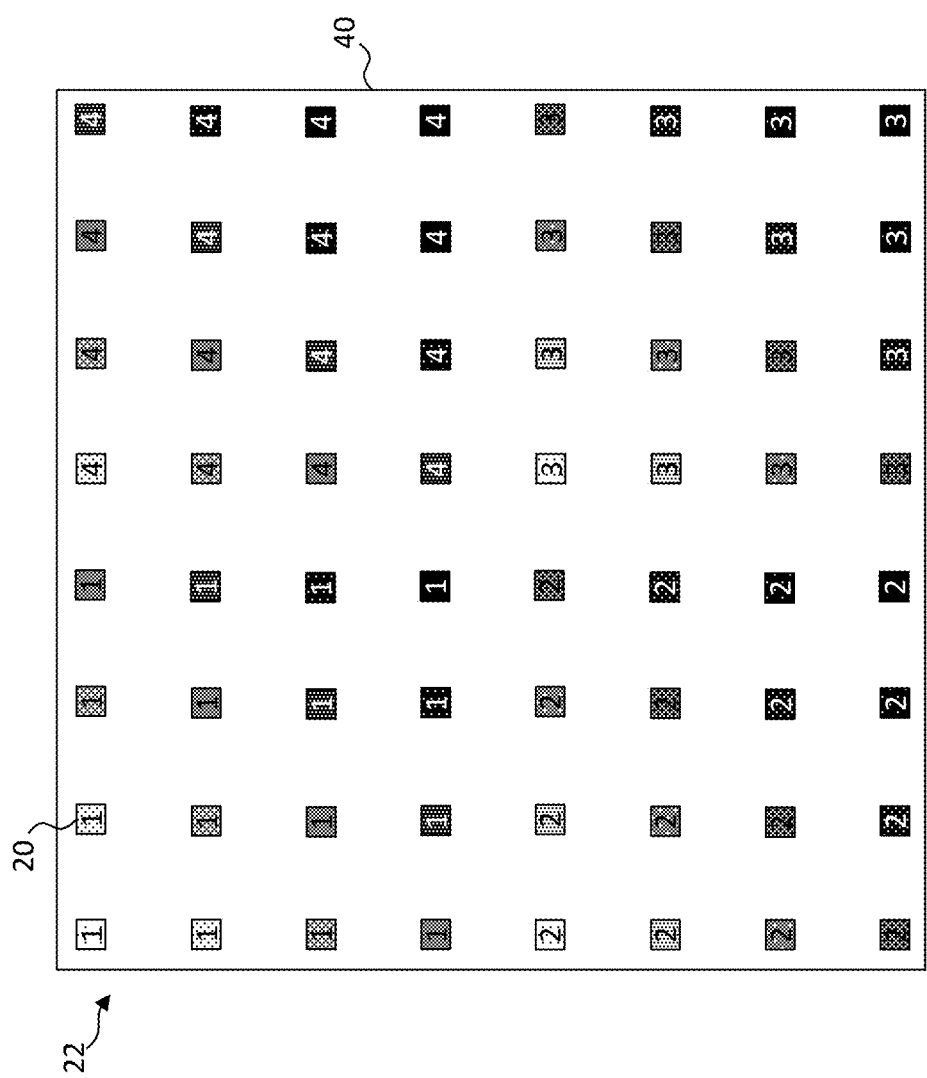
FIG. 33 is a plan view of a native source substrate with an 8×8 array of components labeled according to a stamp pick-up method according to illustrative embodiments of the present disclosure.
Figure 35:
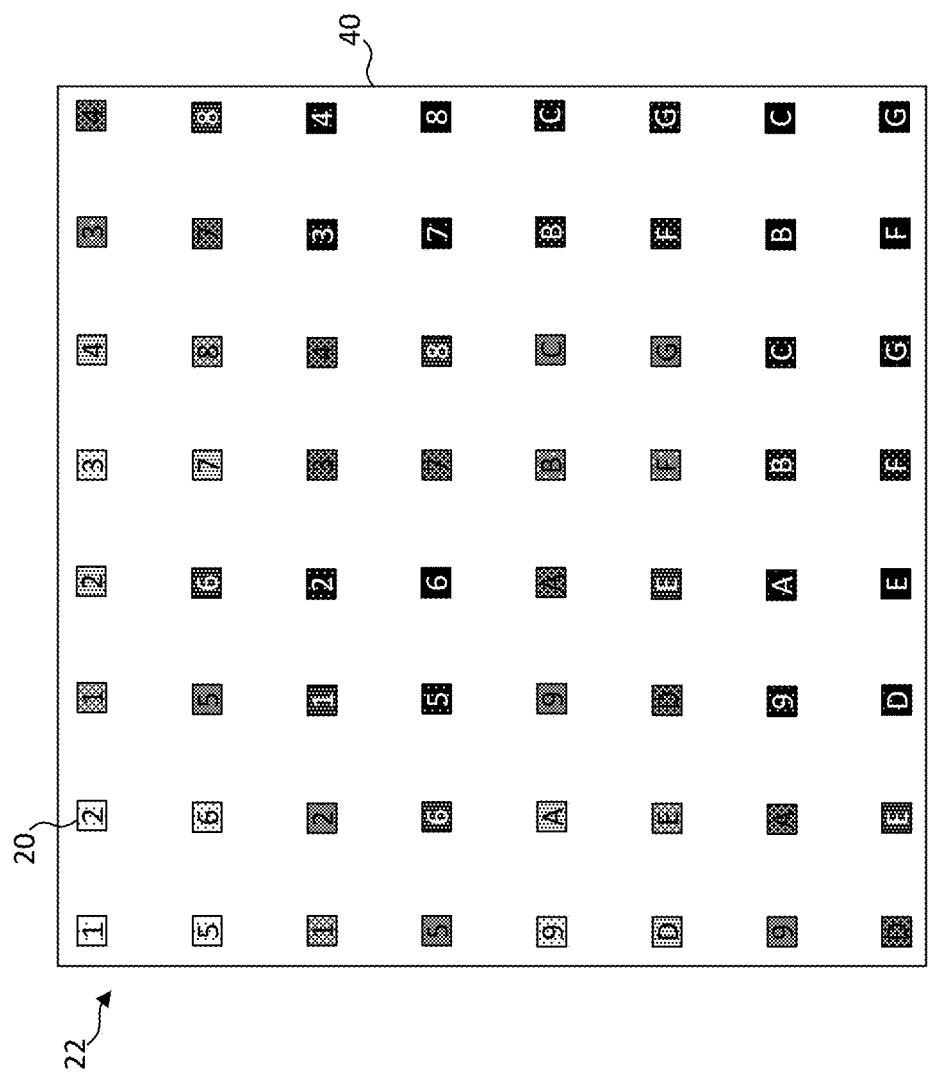
FIG. 35 is a plan view of a destination substrate with printed components from the native source substrate corresponding to FIG. 32 according to illustrative embodiments of the present disclosure.

As used herein, a different orientation can, but does not necessarily, include components 20 micro-transfer printed (step 160) with a different rotation, for example rotated in an array 22 adjacent to a micro-transfer printed array 22 of components 20, for example as shown in FIG. 32 discussed below. In some embodiments, a different orientation can include micro-transfer printed (step 160) components 20 that overlap with a micro-transfer printed array 22 of components 20. Overlapping arrays 22 of components 20 can be interlaced (e.g., interdigitated), for example as shown in FIG. 35 discussed below. In some embodiments, a different orientation can include arrays 22 of components 20 micro-transfer printed (step 160) to adjacent locations on a destination substrate 40 that are micro-transfer printed from locations on a component source wafer 10 that are not adjacent. In some embodiments, multiple different orientations are employed for micro-transfer printed arrays 22 of components 20, for example as shown in FIG. 33 discussed below. For example, an array 22 of components 20 with a different orientation from another array 22 of components 20 can be rotated and offset with respect to the other array 22 of components 20. Adjacent arrays 22 of components 20 are arrays 22 of components 20 that do not overlap and are not interlaced (e.g., interdigitated or intermingled) on a destination substrate 40 but that include components 20 that are in neighboring rows or columns (for example as shown in FIGS. 23, 26, and 31 discussed below) so that there are no components 20 between components 20 in adjacent arrays 22 on destination substrate 40 that are not in the adjacent arrays 22 of components 20 on component source wafer 10. That is, components 20 in adjacent arrays 22 on destination substrate 40 are not separated by any components 20 that are not part of the adjacent arrays 22 of components 20 on component source wafer 10.

Different orientations for micro-transfer printing can be enabled by moving any one or any combination of component source wafer 10, stamp 30, or destination substrate 40. For example, stamp 30 can be rotated after component 20 pickup from component source wafer 10 and before component 20 printing to destination substrate 40, destination substrate 40 can be rotated in different directions or in different amounts before each micro-transfer print step 160, or component source wafer 10 can be rotated in different directions or in different amounts before each micro-transfer pickup step 140.

Figure 10A:
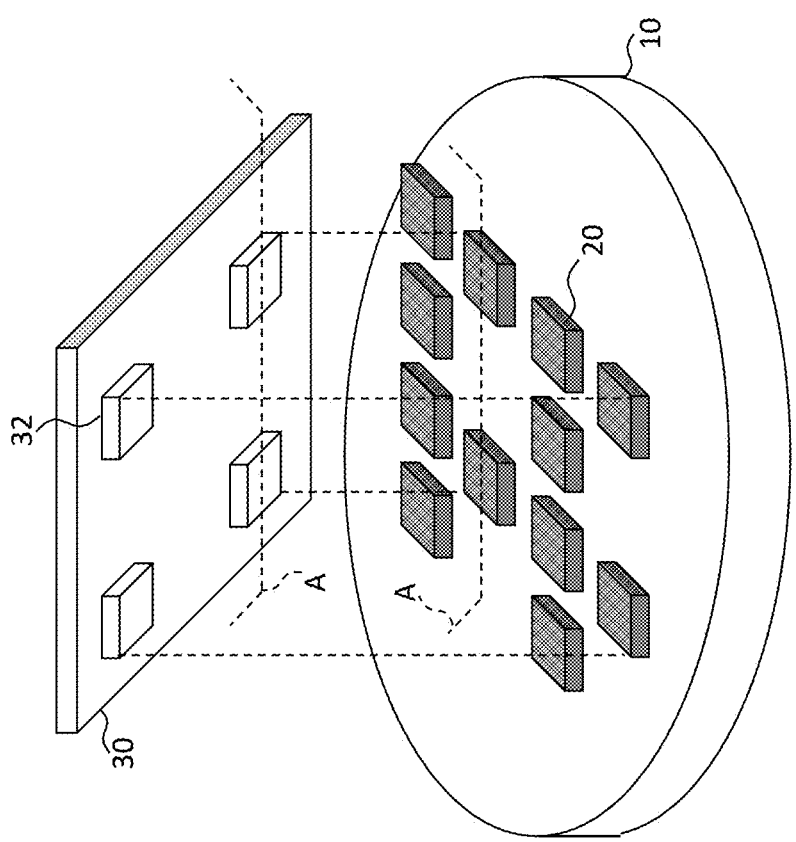
FIG. 10A is a perspective and FIG. 10B is a schematic cross section taken along cross section line A of FIG. 10A of the stamp and component source wafer before picking up a second subset of components with the stamp according to illustrative embodiments of the present disclosure.
Figure 10B:
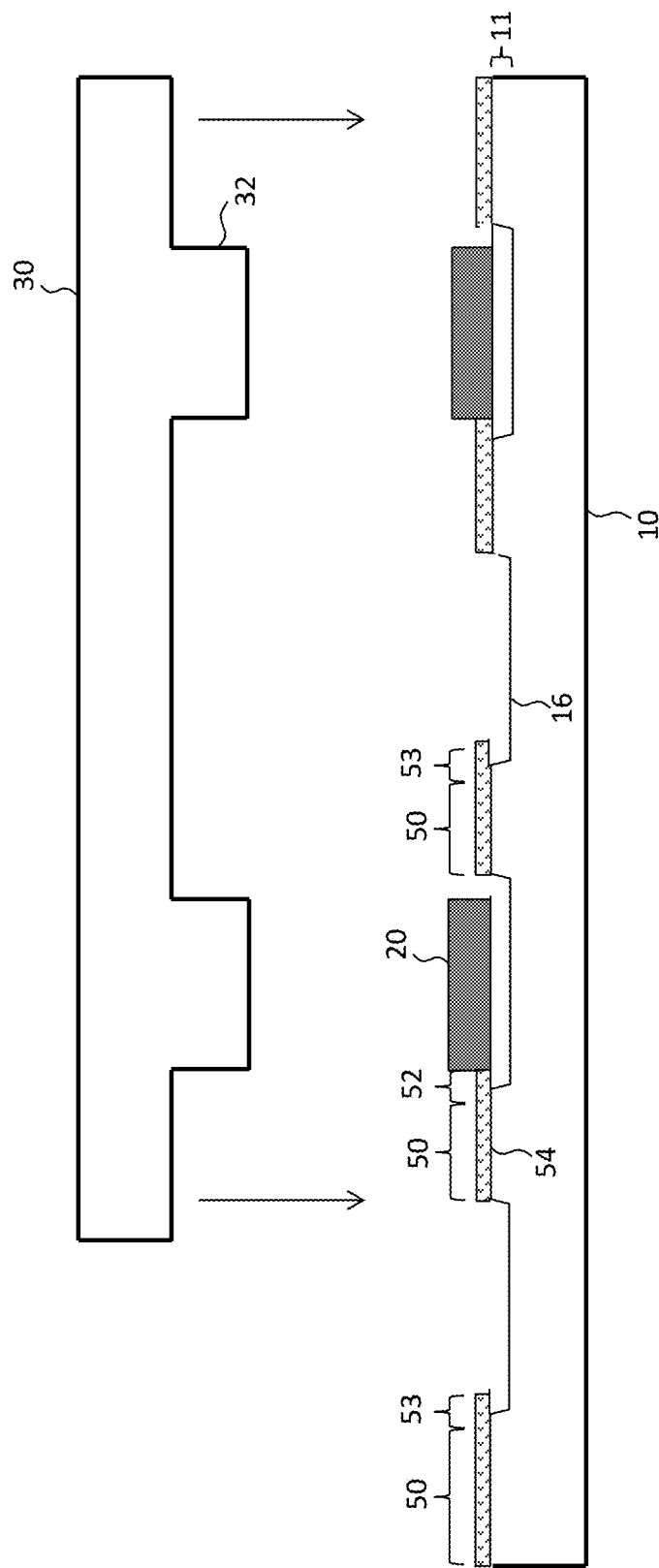
Figure 11:
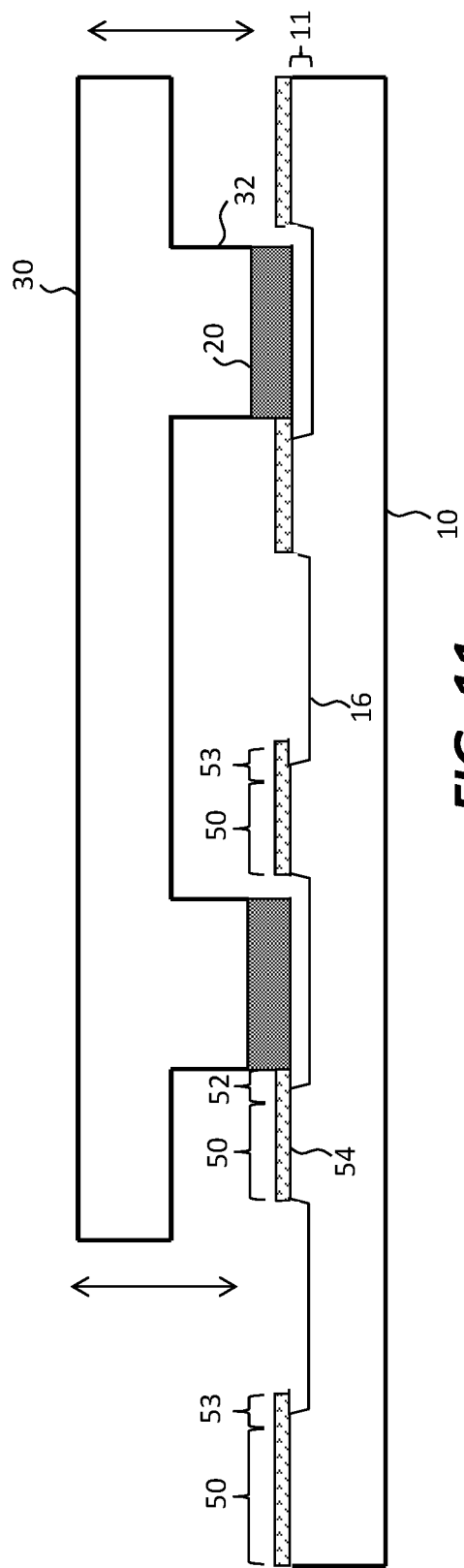
FIG. 11 is a schematic cross section of the stamp in contact with the second subset of components on the component source wafer according to illustrative embodiments of the present disclosure.
Figure 12B:
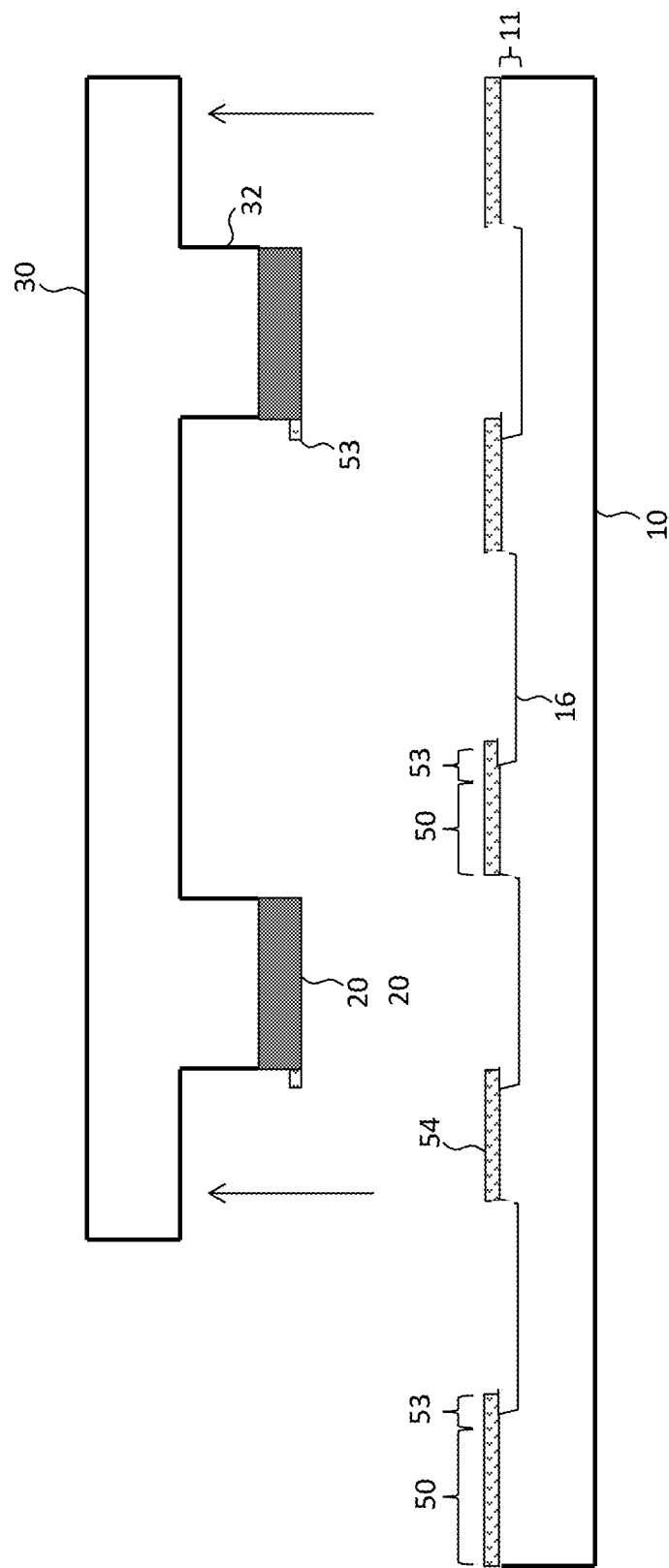

Referring next to the perspective of FIG. 10A and cross section of FIG. 10B taken along cross section line A of FIG. 10A, stamp 30 is aligned with components 20 suspended over gaps 16 (step 130), brought into contact with components 20 on component source wafer 10 (shown in FIG. 11), and then removed from component source wafer 10 by the motion platform, fracturing component tethers 52 from anchors 50 to form separated or fractured component tethers 53 and picking up components 20 from component source wafer 10 with stamp 30 in step 140, as shown in the perspective of FIG. 12A and the corresponding cross section of FIG. 12B taken across cross section line A of FIG. 12A.

Figure 13A:
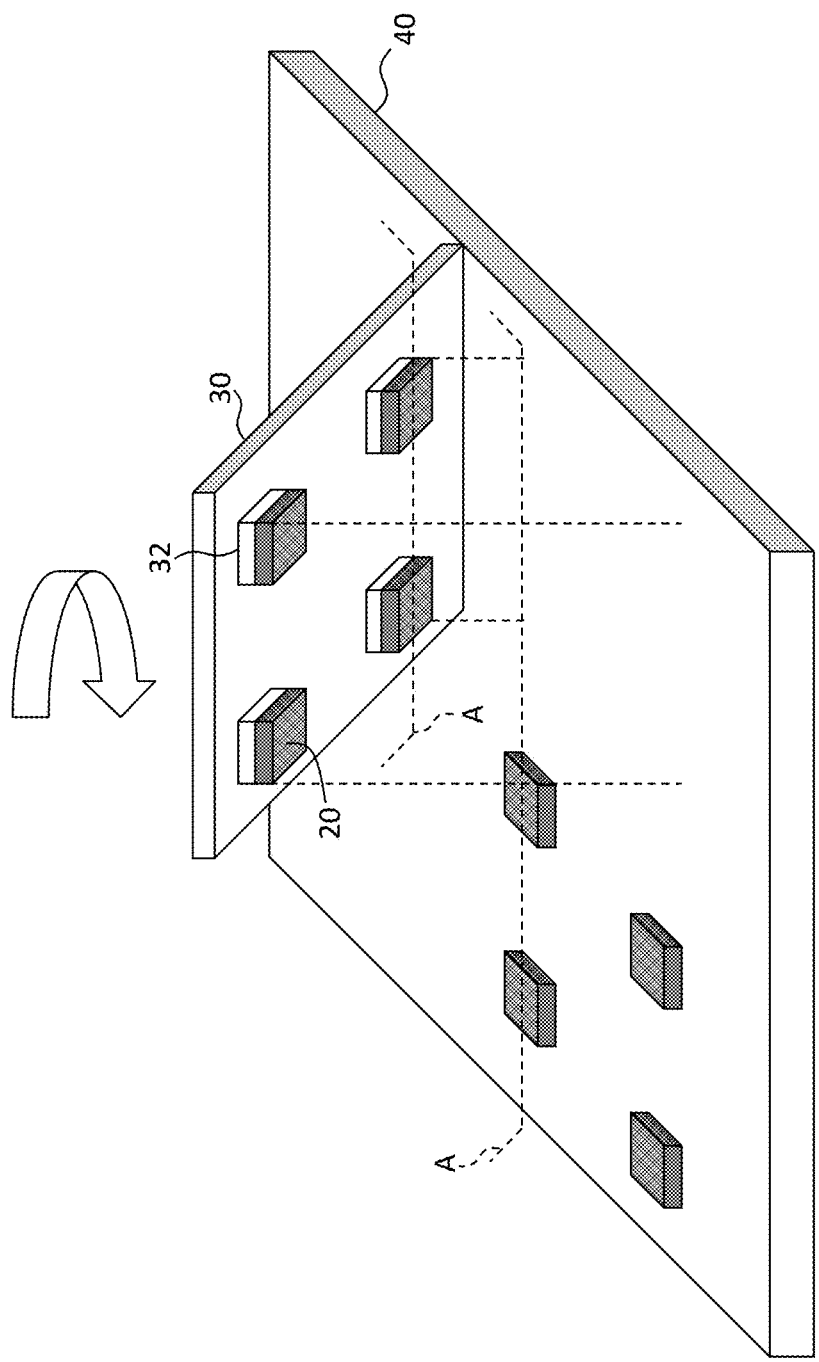
FIG. 13A is a perspective and FIG. 13B is a schematic cross section taken along cross section line A of FIG. 13A of the stamp before micro-transfer printing the second subset of components from the stamp to the destination substrate in a rotated configuration according to illustrative embodiments of the present disclosure.
Figure 13B:
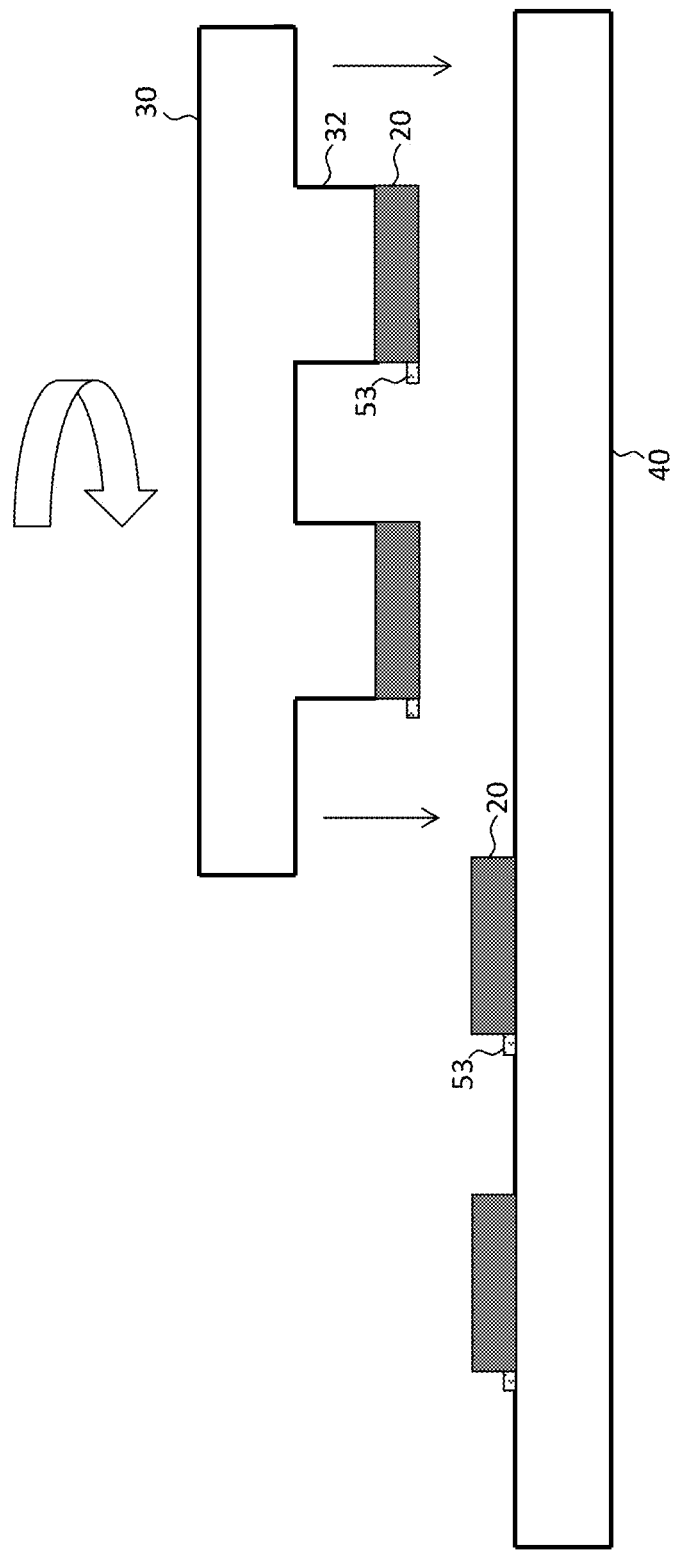
Figure 14:
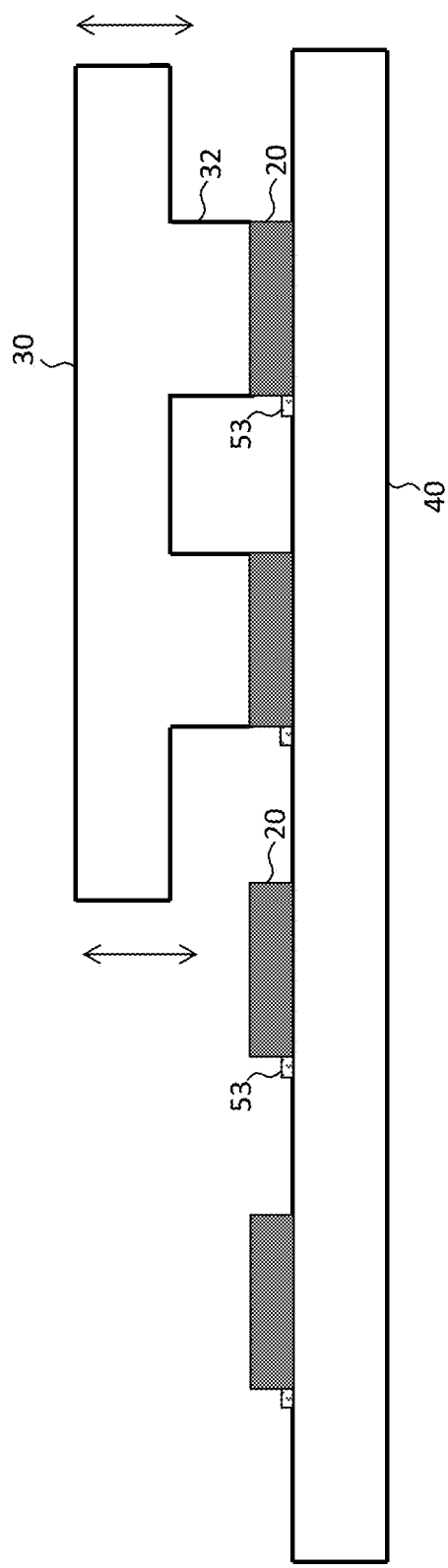
FIG. 14 is a cross section of the stamp micro-transfer printing the second subset of components to the destination substrate in a rotated configuration according to illustrative embodiments of the present disclosure.
Figure 15A:
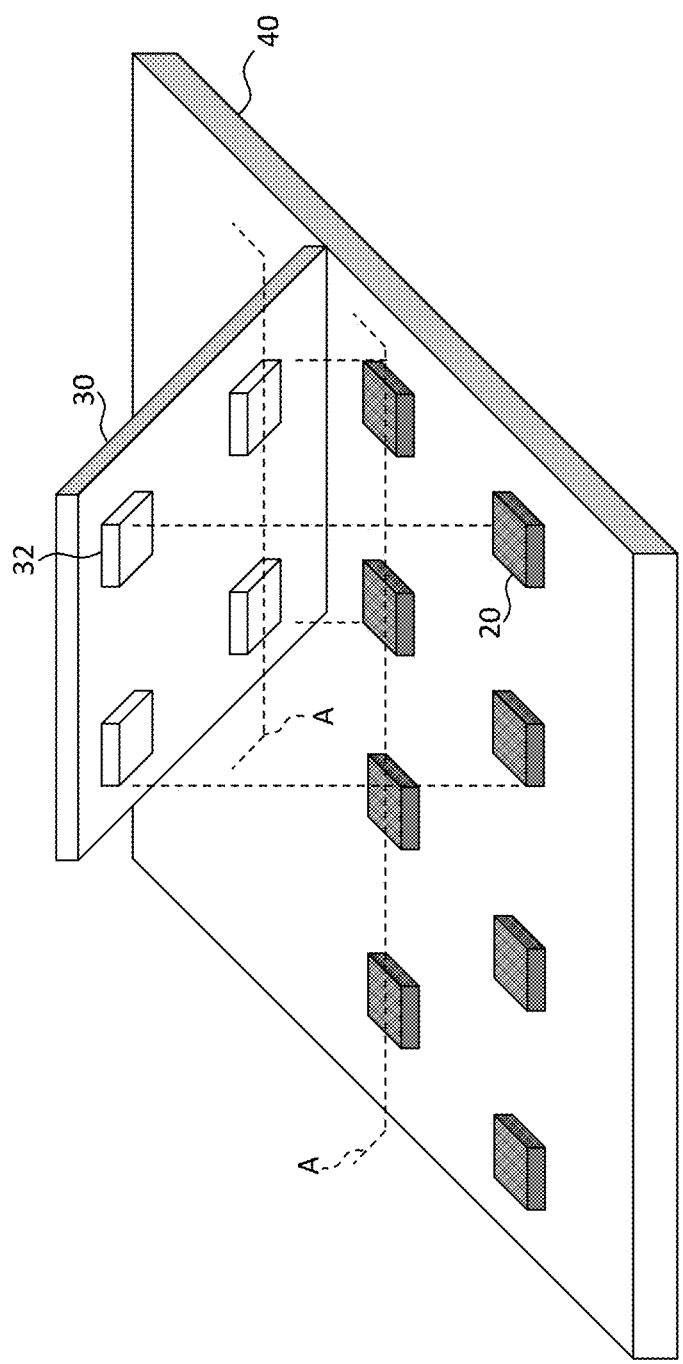
FIG. 15A is a perspective and FIG. 15B is a cross section taken along cross section line A of FIG. 15A of the stamp and destination substrate after micro-transfer printing the second subset of components from the stamp to the destination substrate in a rotated configuration according to illustrative embodiments of the present disclosure.
Figure 15B:
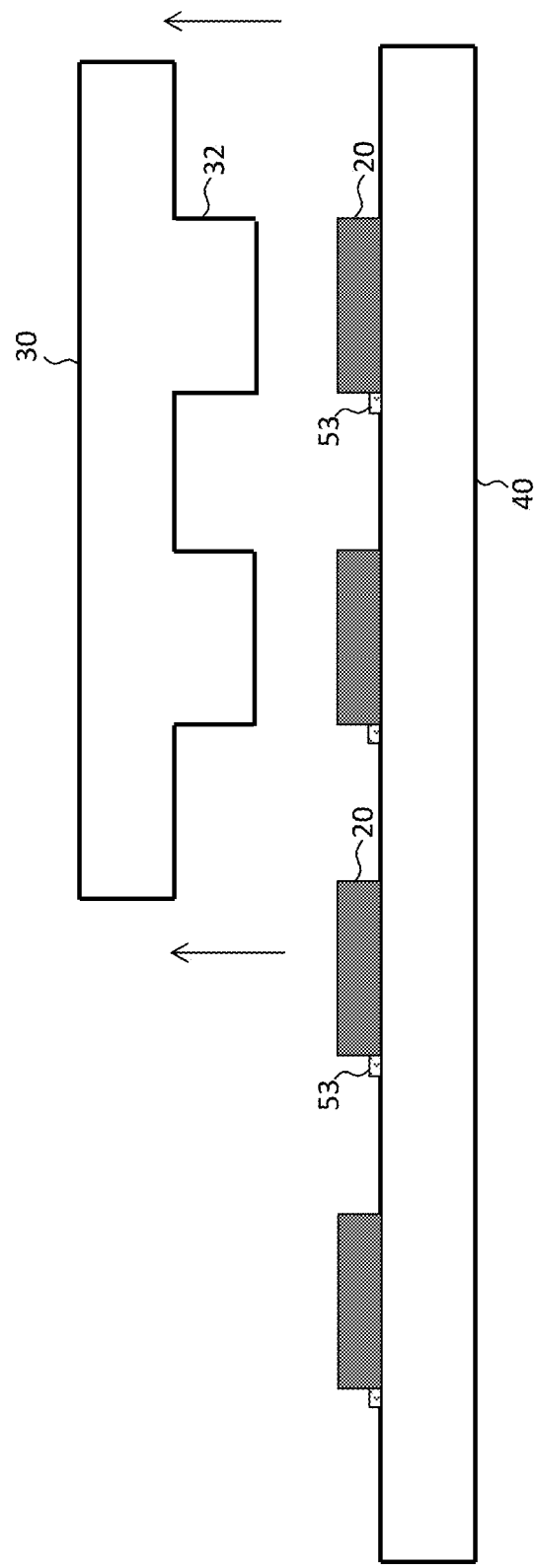
Figure 16:
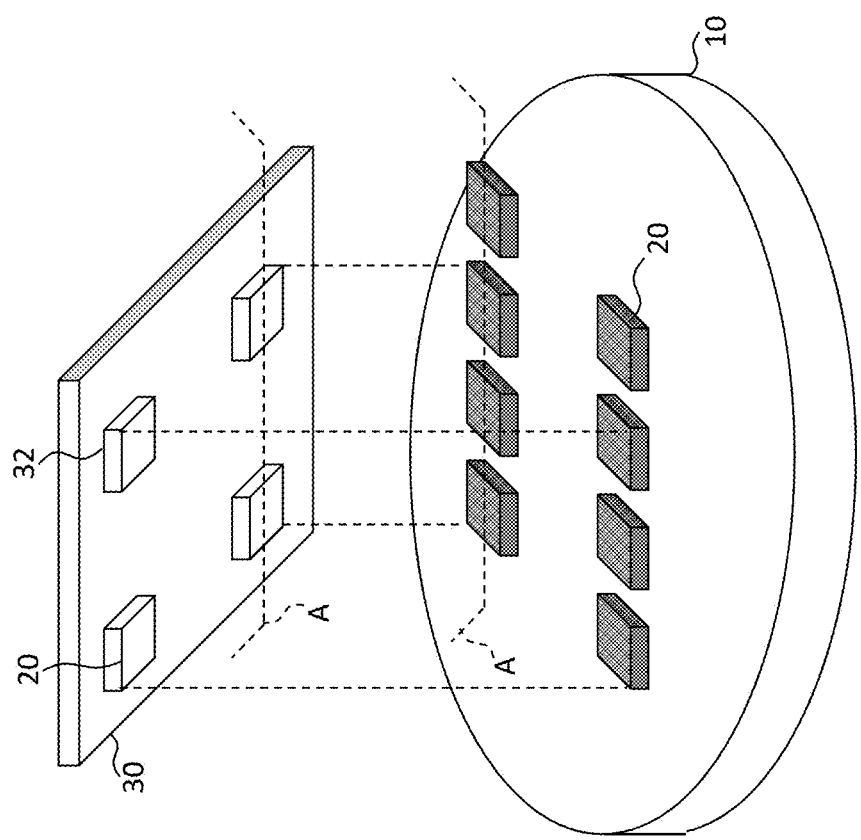
FIG. 16 is a perspective of the stamp and component source wafer before picking up a third subset of components with the stamp according to illustrative embodiments of the present disclosure.

As shown in the perspective of FIG. 13A and cross section of FIG. 13B taken along cross section line A of FIG. 13A, stamp 30 and stamp components 20 with fractured component tethers 53 are moved into position with respect to destination substrate 40 (step 150). However, before micro-transfer printing components 20 to destination substrate 40 with stamp 30 in step 160, stamp 30 or destination substrate 40 is provided in a different orientation, for example by rotating stamp 30 or destination substrate 40, as indicated by the circular arrow in FIGS. 13A, 13B. Alternatively, as described below, stamp 30 or component source wafer 10 is provided in a different orientation before component 20 pickup in step 140, for example by rotating stamp 30 or component source wafer 10. Referring to FIG. 14, in step 160 picked-up stamp components 20 with fractured component tethers 53 are micro-transfer printed to destination substrate 40 in step 160 and, referring to FIGS. 15A and 15B, stamp 30 is removed from destination substrate 40.

Thus, according to some embodiments of the present disclosure, a method of micro-transfer printing comprises providing a component source wafer 10 and components 20 disposed in, on, or over component source wafer 10 (step 100), providing a destination substrate 40 (step 120), and providing a stamp 30 for transferring components 20 from component source wafer 10 to destination substrate 40 (step 110), where component source wafer 10 has an attribute or structure 12 that varies (e.g., monotonically) across component source wafer 10 that affects the structure, operation, appearance, or performance of the components 20. In steps 130, 140, 150, 160, a first array 22 of components 20 is transferred from component source wafer 10 to destination substrate 40 with a first orientation and in step 145, 130, 140, 150, 160 a second array 22 of components 20 is transferred from component source wafer 10 to destination substrate 40 with a second orientation different from the first orientation. Component 20 transfer can be performed using micro-transfer printing (e.g., dry contact printing), for example.

Figure 17:
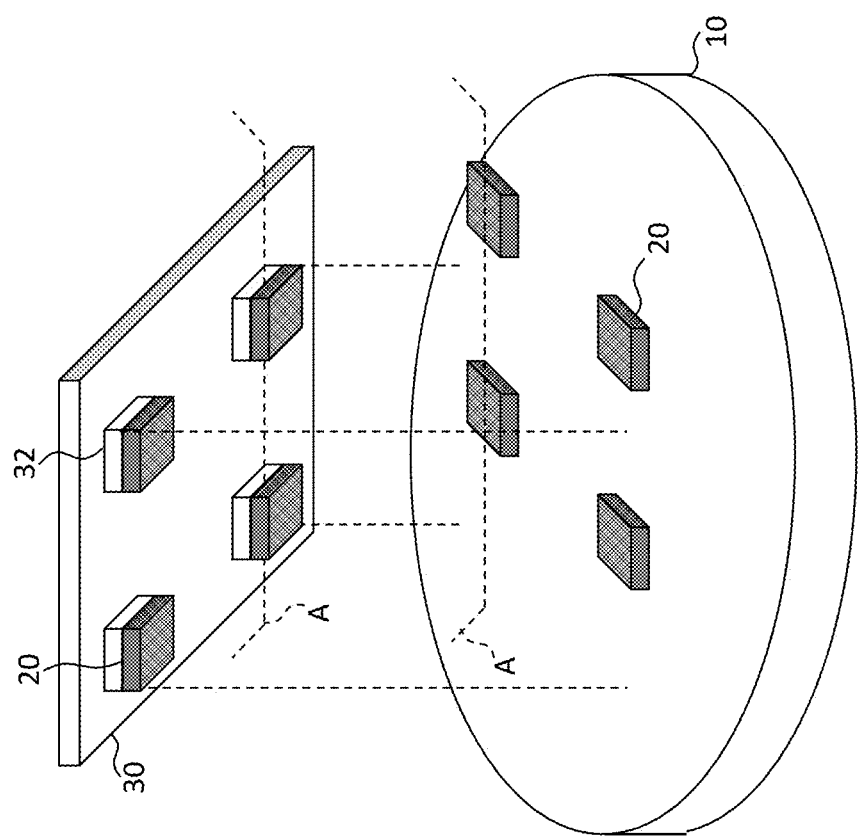
FIG. 17 is a perspective of the stamp with the third subset of components removed from the component source wafer according to illustrative embodiments of the present disclosure.
Figure 18:
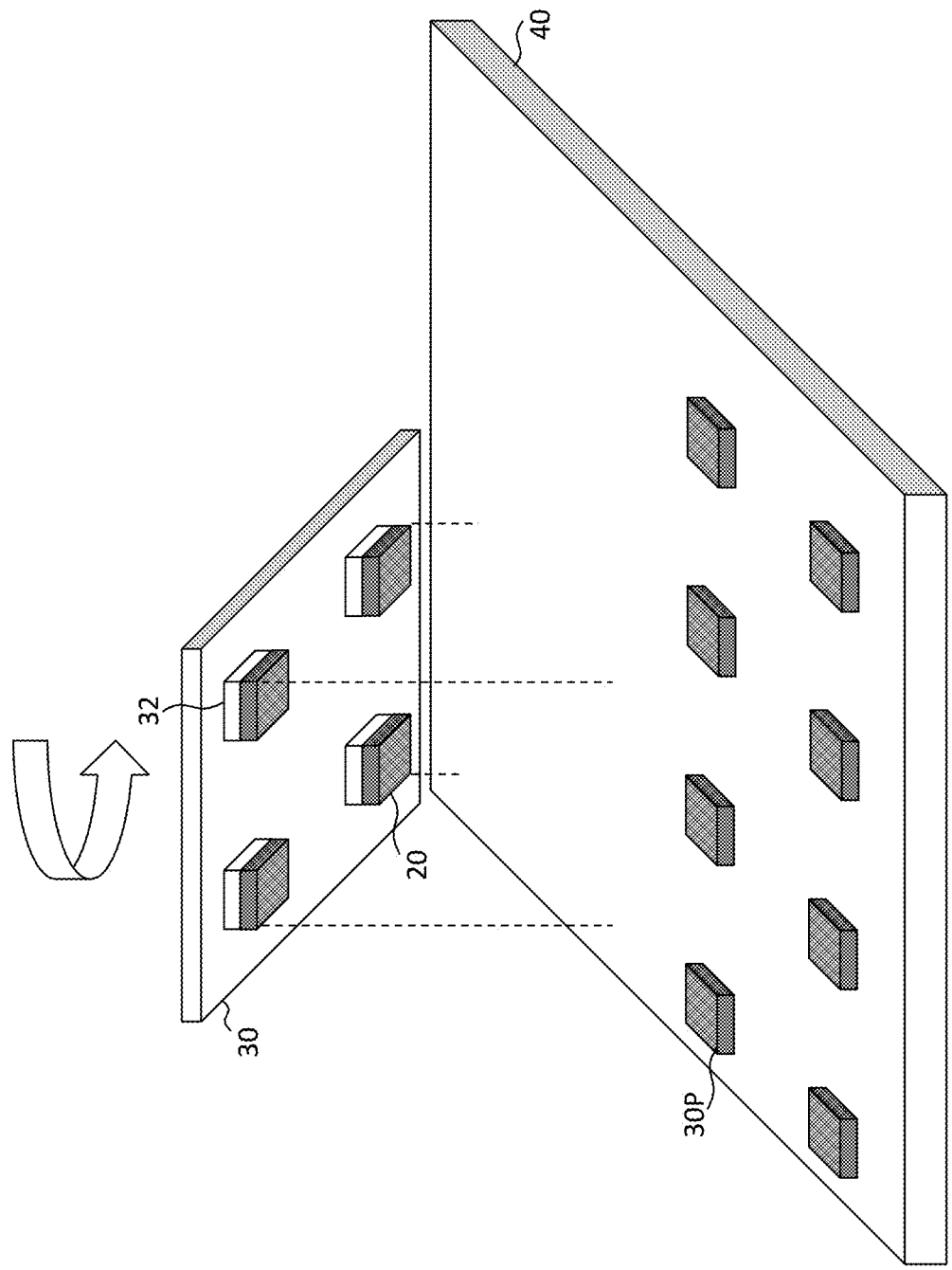
FIG. 18 is a perspective of the stamp before micro-transfer printing the third subset of components from the stamp to the destination substrate in a rotated configuration according to illustrative embodiments of the present disclosure.
Figure 19:
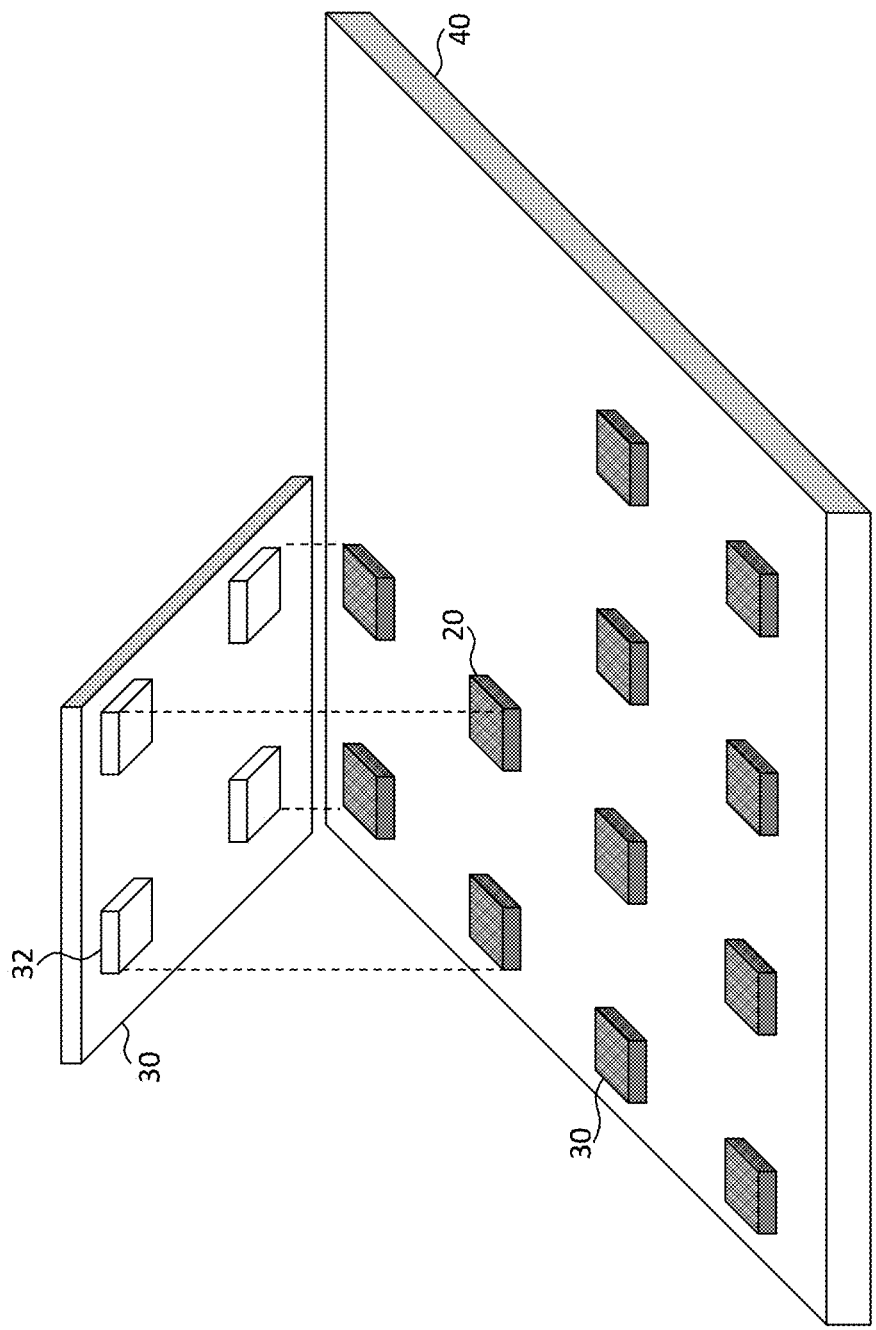
FIG. 19 is a perspective of the stamp after micro-transfer printing the third subset of components from the stamp to the destination substrate in a rotated configuration according to illustrative embodiments of the present disclosure.
Figure 20:
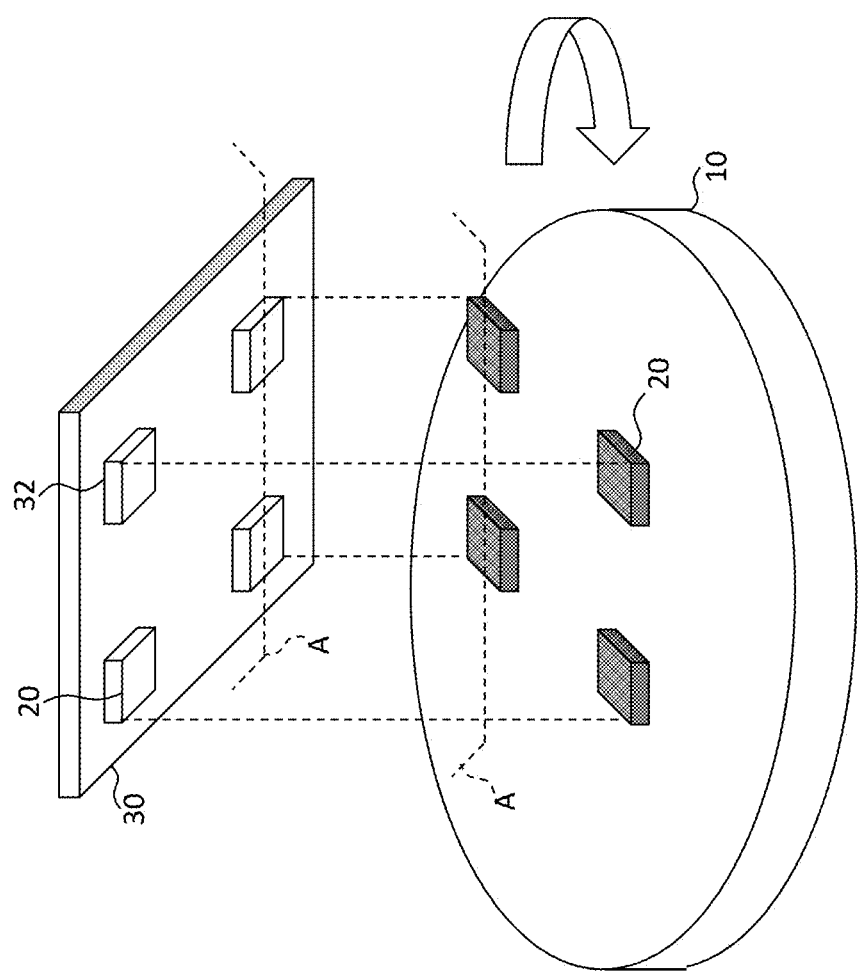
FIG. 20 is a perspective of the stamp and component source wafer in a rotated configuration before micro-transfer printing a fourth subset of components according to illustrative embodiments of the present disclosure.

The process of printing components 20 in different orientations is repeated again. Referring to the perspective of FIG. 16, stamp 30 is aligned with components 20 on component source wafer 10 (step 130), brought into contact with components 20 on component source wafer 10, and then removed from component source wafer 10 by the motion platform, fracturing component tethers 52 from anchors 50 to form separated or fractured component tethers 53 and picking up components 20 from component source wafer 10 with stamp 30 in step 140, as shown in the perspective of FIG. 17. As shown in the perspective of FIG. 18, stamp 30 and stamp components 20 with fractured component tethers 53 are moved into position in a different orientation (illustrated by the circular arrow rotated in an opposite direction with respect to FIG. 13A, 13B) with respect to destination substrate 40 (step 150). Referring to FIG. 19, in step 160 picked-up stamp components 20 with fractured component tethers 53 are micro-transfer printed to destination substrate 40 in step 160 and stamp 30 is removed from destination substrate 40.

Figure 21:
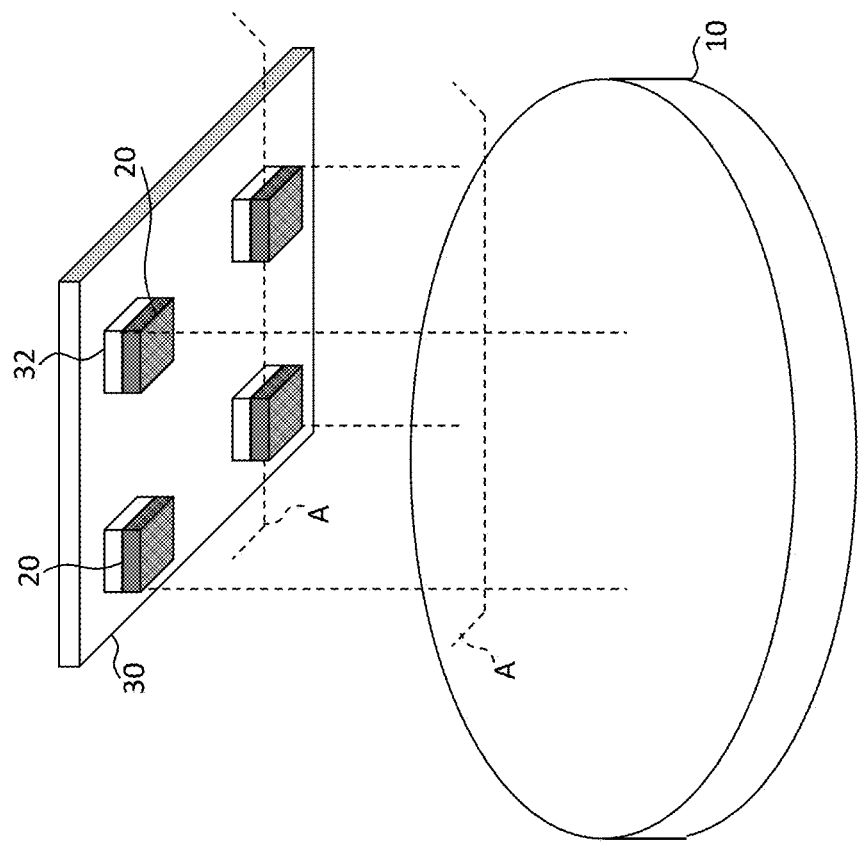
FIG. 21 is a perspective of the stamp with the fourth subset of components removed from the component source wafer according to illustrative embodiments of the present disclosure.
Figure 22:
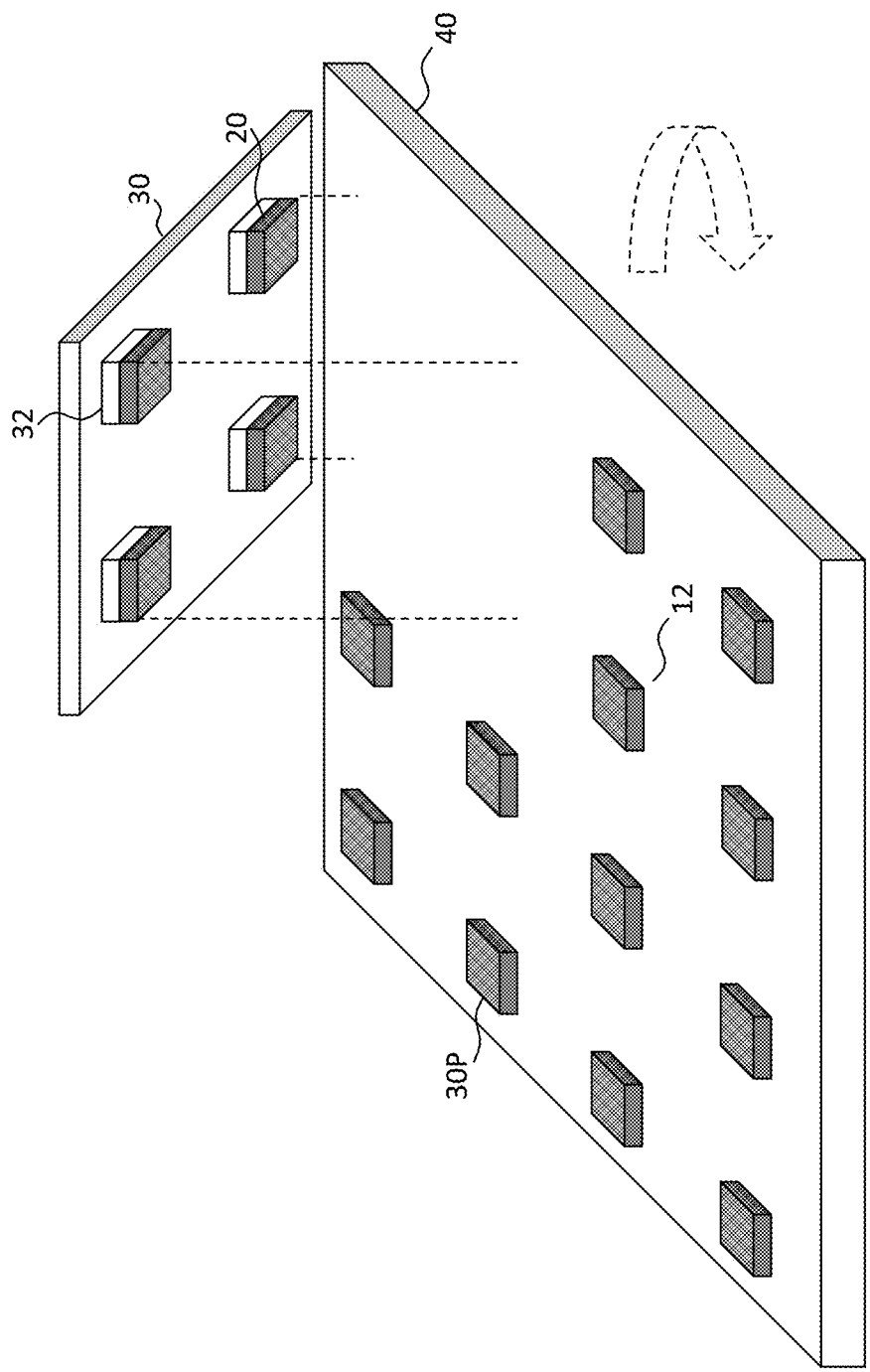
FIG. 22 is a perspective of the stamp before micro-transfer printing the fourth subset of components from the stamp to the destination substrate in a rotated configuration according to illustrative embodiments of the present disclosure.

The process of printing components 20 in different orientations is repeated again for remaining components 20. Referring to the perspective of FIG. 20, stamp 30 is aligned with components 20 on component source wafer 10 (step 130). In this step, component source wafer 10 is provided in a different orientation (illustrated by the circular arrow), rather than providing the stamp in a different orientation, as in FIGS. 13A-B and FIG. 18. Stamp posts 32 of stamp 30 are brought into contact with components 20 on component source wafer 10, and then removed from component source wafer 10 by the motion platform, fracturing component tethers 52 from anchors 50 to form separated or fractured component tethers 53 and picking up components 20 from component source wafer 10 with stamp 30 in step 140, as shown in the perspective of FIG. 21. As shown in the perspective of FIG. 22, stamp 30 and stamp components 20 with fractured component tethers 53 are moved into position with respect to destination substrate 40 (step 150). A dashed circular arrow is illustrated in FIG. 22 to illustrate that destination substrate 40 can be rotated instead of rotating component source wafer 10 in FIG. 20 or stamp 30 in FIG. 16 to provide components 20 in a different orientation on destination substrate 40. As shown in FIG. 23, in step 160 picked-up stamp components 20 with fractured component tethers 53 are micro-transfer printed to destination substrate 40 in step 160 and stamp 30 is removed from destination substrate 40.

Components 20 are all micro-transfer printed from component source wafer 10 to destination substrate 40 in various orientations (step 170) and the process is completed (step 180).

Figure 25:
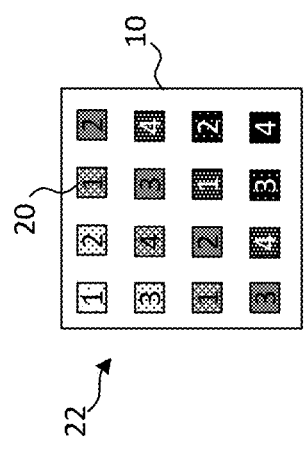
FIG. 25 is a plan view of a native source substrate with components labeled according to a stamp pick-up method useful in understanding embodiments of the present disclosure.

FIG. 25 is an illustration of a component source wafer 10 having a four-by-four array 22 of components 20 whose attributes 12 vary monotonically (e.g., linearly) in each of two dimensions, indicated by the shading of the components 20 and corresponding to FIG. 3 (in a smaller component array 22). Components 20 on component source wafer 10 are labeled with a number corresponding to the stamp operation that micro-transfer prints components 20 from component source wafer 10 to destination substrate 40 using a stamp 30 with a two-by-two array of stamp posts 32, so that four stamp operations are required to complete the transfer, as described with respect to FIGS. 4A-23 above. Stamp operations that do not micro-transfer print components 20 in different orientations result in a distribution of components 20 on destination substrate 40, for example without different rotations. as shown in FIG. 26. As shown in FIG. 26 by the shading of components 20, the attribute 12 variation of component source wafer 10 is repeated multiple times, albeit at a different resolution on destination substrate 40 than on component source wafer 10.

Figure 27:
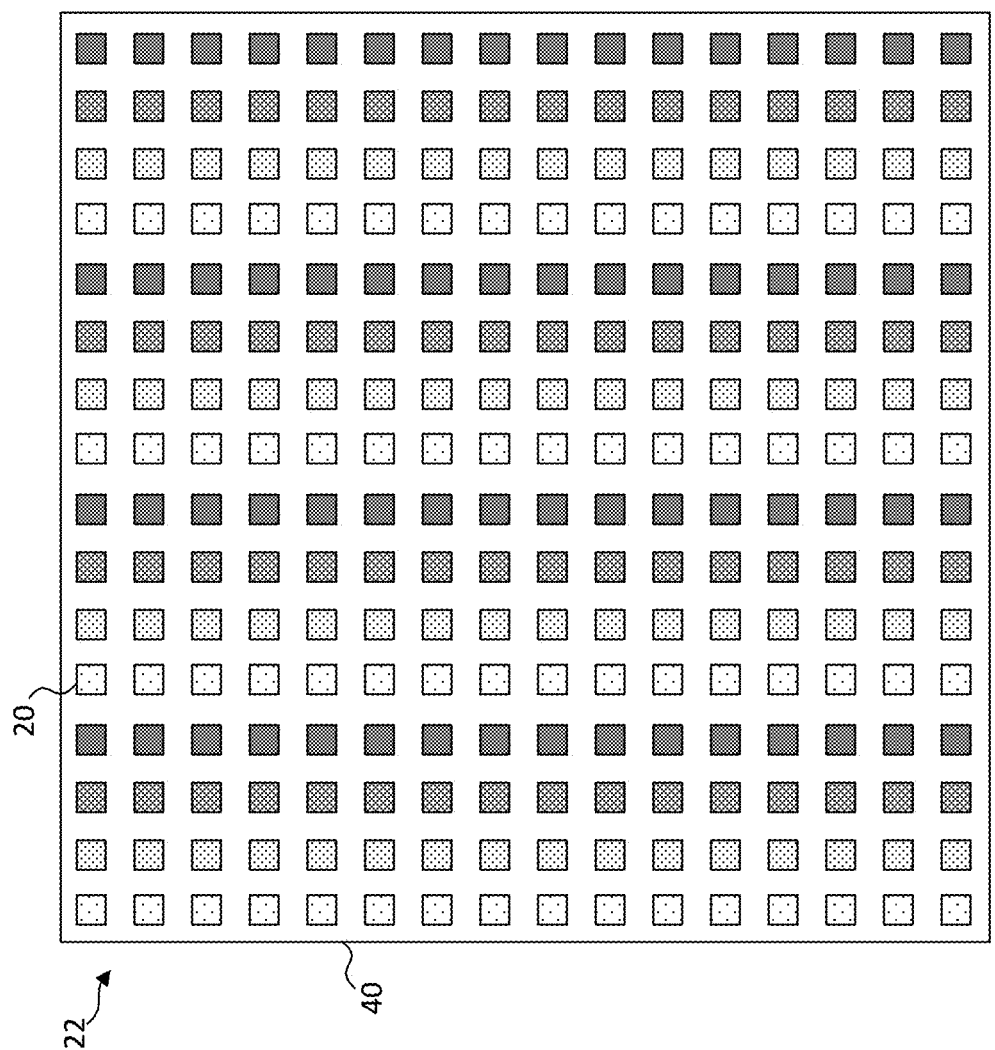
FIG. 27 is a plan view of a destination substrate with printed components from a native source substrate corresponding to FIG. 2 useful in understanding embodiments of the present disclosure.
Figure 28:
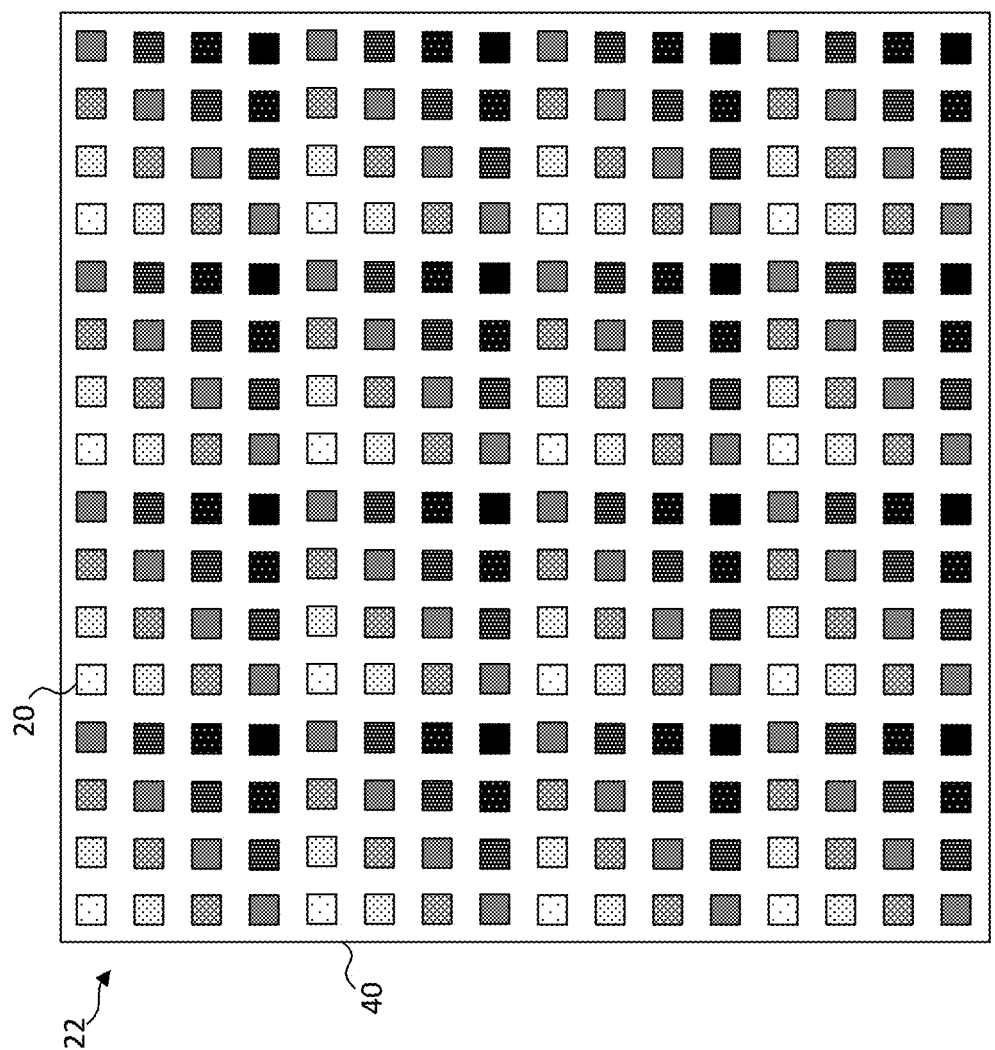
FIG. 28 is a plan view of a destination substrate with printed components from a native source substrate corresponding to FIG. 3 useful in understanding embodiments of the present disclosure.

FIG. 27 illustrates the result of micro-transfer printing sixteen four-by four arrays 22 of components 20 from a component source wafer 10 (e.g., corresponding to FIG. 2) onto a destination substrate 40 in a common orientation, for example without different rotations. Similarly, FIG. 28 illustrates the result of micro-transfer printing sixteen four-by four arrays 22 of components 20 from a component source wafer 10 (e.g., corresponding to FIG. 3) onto a destination substrate 40 in a common orientation, for example without different rotations. As shown by the shading of components 20, in these cases (FIGS. 26-28) the attribute 12 variation of component source wafer 10 is repeated multiple times in either one dimension (horizontally, as shown in FIG. 27) or in two dimensions (horizontally and vertically, as shown in FIG. 28) albeit at a different resolution on destination substrate 40 than on component source wafer 10.

Figure 29:
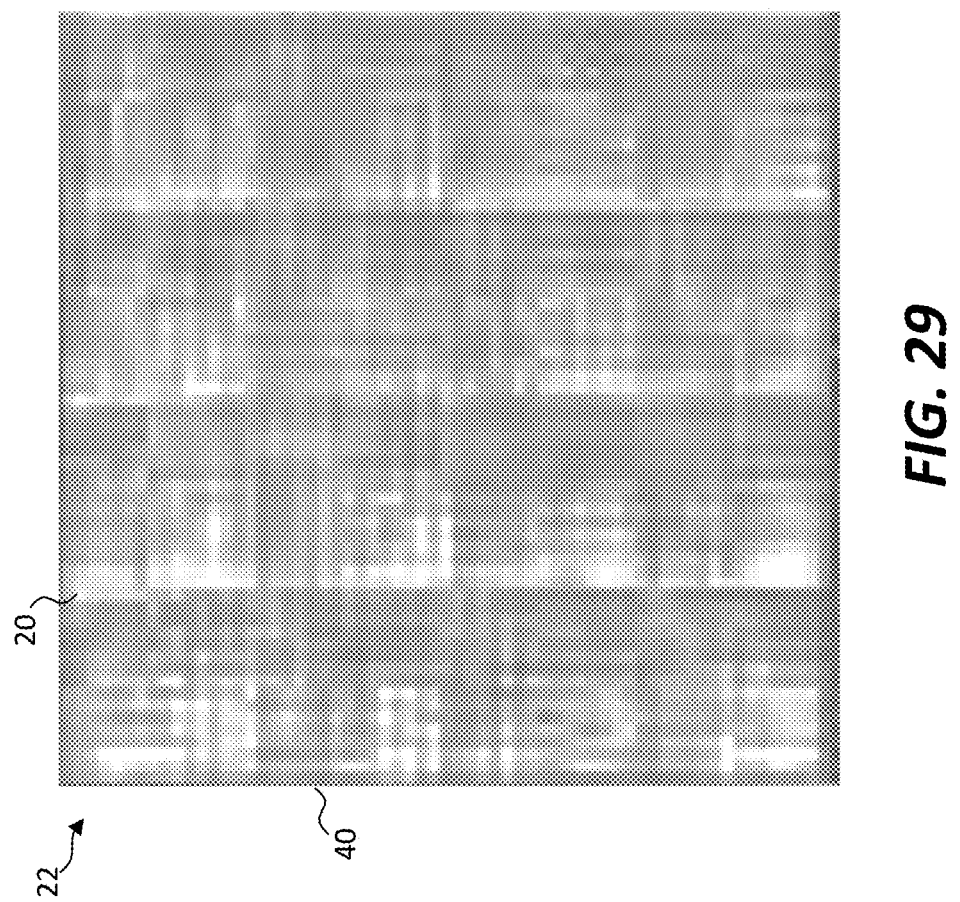
FIG. 29 is a micrograph of a destination substrate with printed components from a native source substrate corresponding to FIG. 3 in operation useful in understanding embodiments of the present disclosure.

FIG. 29 is a micrograph of sixteen arrays 22 of components 20 micro-transfer printed in a common orientation, for example without different rotations, from a component source wafer 10 (e.g., corresponding to FIG. 3) to a destination substrate 40. The regular variation in component attributes 12 is readily visible. Such variation can be considered a form of pattern noise or fixed-pattern noise, often associated with image sensors. Such noise can be addressed by flat-field correction techniques that control the operation of components 20 electronically. However, according to some embodiments of the present disclosure, the variation (non-uniformity) can also be addressed by transferring arrays 22 of components 20 from a component source wafer 10 to a destination substrate 40 using different orientations for components 20, for example using micro-transfer printing or contact printing.

Figure 30:
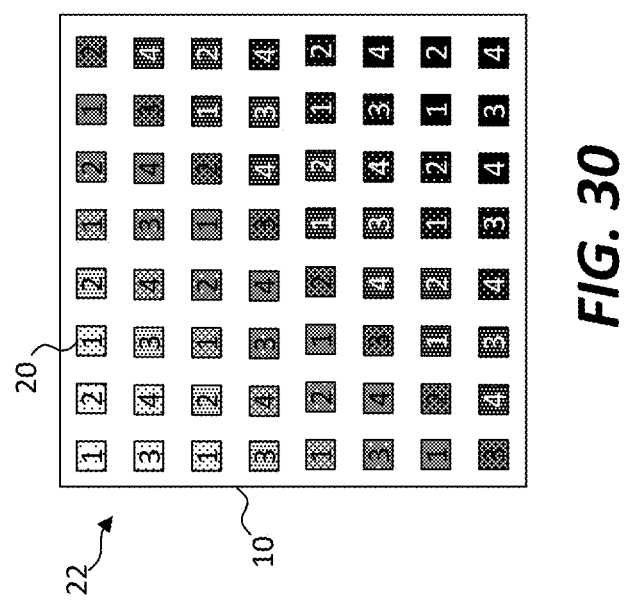
FIG. 30 is a plan view of a native source substrate with an 8×8 array of components labeled according to a stamp pick-up method useful in understanding embodiments of the present disclosure.

FIG. 30 is an illustration of a component source wafer 10 having an eight-by-eight array 22 of components 20 whose attributes 12 vary in two dimensions, indicated by the shading of the components 20 and corresponding to FIG. 3 (in a smaller array 22 of components 20) and FIG. 25 (in a larger array 22 of components 20). Components 20 on component source wafer 10 are labeled with a number corresponding to the operation (e.g., stamp operation) that transfers (e.g., micro-transfer prints) components 20 from component source wafer 10 to destination substrate 40, for example using a stamp 30 with a four-by-four array of stamp posts 32 spaced apart by two components 20, so that four operations are required to complete the transfer of the shown array. Operations that do not transfer (e.g., micro-transfer print) components 20 in different orientations result in a distribution of components 20 on destination substrate 40 as shown in FIG. 31. As shown in FIG. 31 by the shading of components 20, the attribute 12 variation of component source wafer 10 is repeated four times, albeit at a different resolution on destination substrate 40.

Referring to FIG. 32, in an illustration according to some embodiments of the present invention, arrays 22 of components 20 transferred (e.g., micro-transfer printed) in operations 2, 3, and 4 (e.g., stamp operations) each have different orientations on destination substrate 40 than the array 22 of components 20 transferred (e.g., micro-transfer printed) in operation 1 (e.g., a stamp operation). Each array 22 of components 20 transferred in operations 2, 3, and 4 is rotated with respect to array 22 of components 20 and is adjacent to array 22 of components 20 transferred in operation 1. Referring to FIG. 33, in an illustration according to some embodiments of the present invention, each array 22 of components 20 transferred (e.g., micro-transfer printed) in operations 2, 3, and 4 (e.g., stamp operations) is offset with respect to array 22 of components 20 as distributed on component source wafer 10 (shown in FIG. 30). Thus, the attribute 12 of components 20 varies less regularly with respect to spatial location on destination substrate 40.

Without wishing to be bound by any particular theory, such variation can be less objectionable to a human visual system for a particular application (e.g., if components 20 are light-emitting diodes in a display). For example, the array 22 shown in FIG. 33, that has been formed using different orientations, has an attribute 12 that varies with some frequency in one or more directions. For example, FIG. 33 shows some variation in the horizontal direction and a diagonal direction (e.g., from top left corner to bottom right corner). The comparative array 22 shown in FIG. 31, that has been formed using only a single orientation, also has an attribute 12 that varies with some frequency in one or more directions. Comparing the arrays 22 of FIG. 31 and FIG. 33, one of ordinary skill can appreciate that the frequency (or amplitude) of variation in at least one direction, for example in the aforementioned diagonal direction, is reduced in the array 22 of FIG. 33. In some embodiments, transferring using different orientations may also increase the frequency (or amplitude) of variation in a different direction, such as the horizontal direction. In some embodiments, multiple different orientations, such as offset and rotation, are used to further reduce variations, for example in multiple directions.

Figure 34:
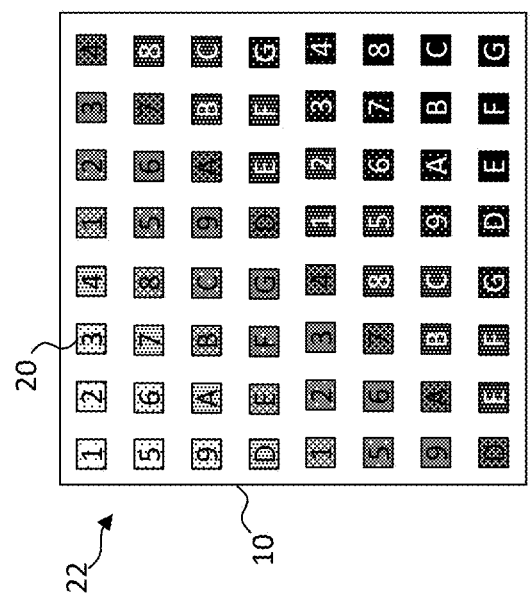
FIG. 34 is a plan view of a native source substrate with an 8×8 array of components labeled according to a stamp pick-up method according to illustrative embodiments of the present disclosure.
Figure 36:
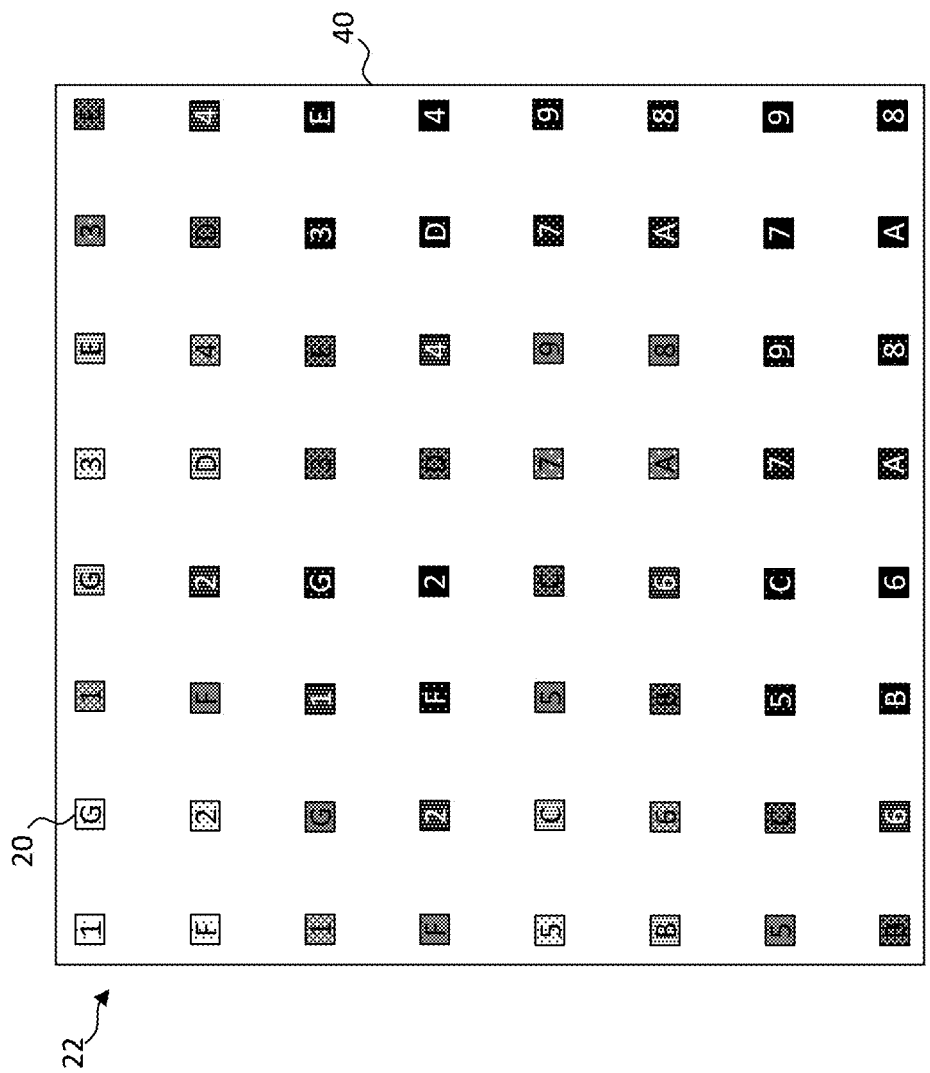
FIG. 36 is a plan view of a destination substrate with printed components from the native source substrate corresponding to FIG. 32 according to illustrative embodiments of the present disclosure.

FIG. 34 is an illustration of a component source wafer 10 having an eight-by-eight array 22 of components 20 whose attributes 12 vary in two dimensions, indicated by the shading of the components 20 and corresponding to FIG. 3 (in a smaller array 22 of components 20) and FIG. 25 (in a larger array 22 of components 20). Components 20 on component source wafer 10 are labeled with a hexadecimal number (starting with '1' and ending with 'G') corresponding to the operation (e.g., stamp operation) that transfers (e.g., micro-transfer prints) components 20 from component source wafer 10 to destination substrate 40, for example using a stamp 30 with a two-by-two array of stamp posts 32, so that sixteen operations are required to complete the transfer of the shown array. As shown in FIG. 35, in an illustration according to some embodiments of the present invention, arrays 22 of components 20 transferred (e.g., micro-transfer printed) in operations 2-G (e.g., stamp operations) each have different orientations than the transferred (e.g., micro-transfer printed) array 22 of components 20 in operation 1 (e.g., a stamp operation). Each array 22 of components 20 transferred in operations 2-G is interlaced (e.g., interdigitated) with respect to array 22 of components 20 transferred in operation 1. As shown in FIG. 36, in an illustration according to some embodiments, each array 22 of components 20 transferred (e.g., micro-transfer printed) in operations 2-G (e.g., stamp operations) is offset and interlaced with respect to array 22 of components 20 transferred (e.g., micro-transfer printed) in operation 1 (e.g., a stamp operation) so that adjacent arrays 22 of components 20 micro-transfer printed on destination substrate 40 are not picked up from adjacent arrays 22 of components 20 on component source wafer 10 and the arrays 22 of components 20 are interlaced.

Figure 37:
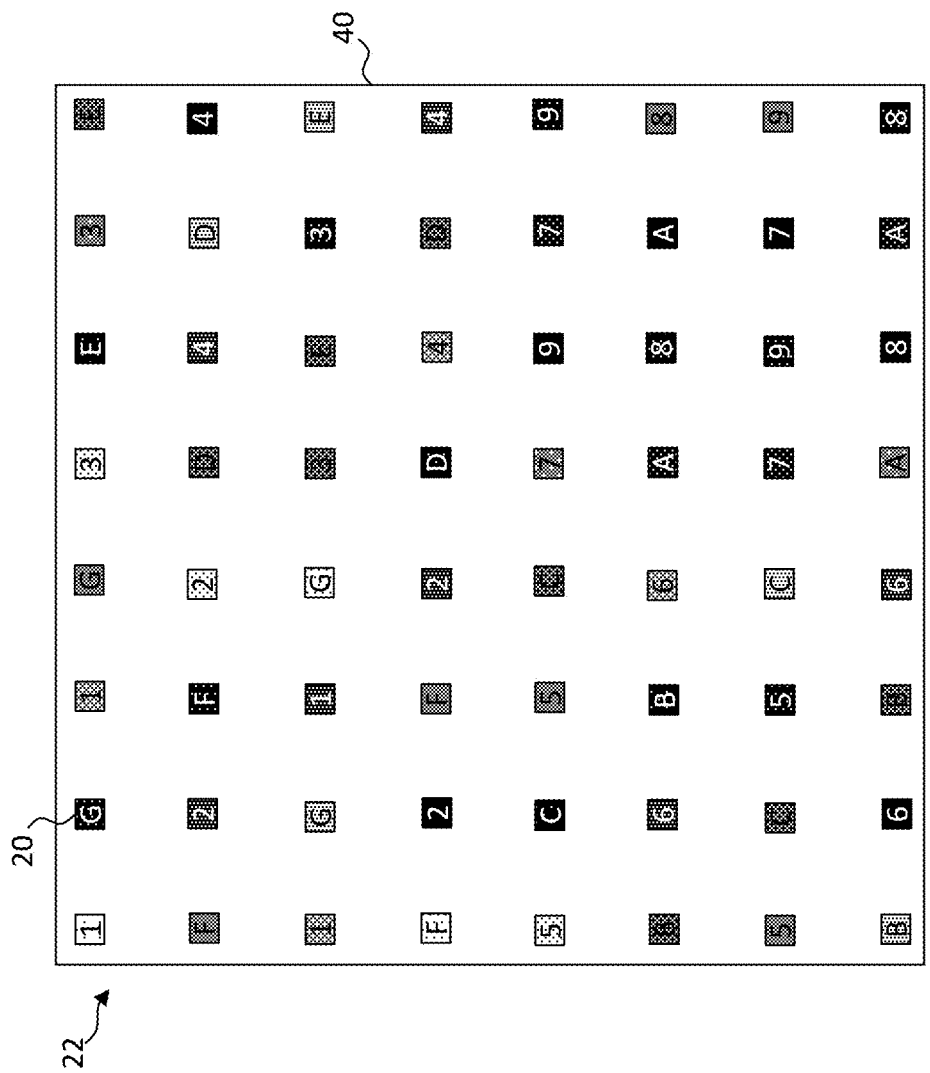
FIG. 37 is a plan view of a destination substrate with printed components from the native source substrate corresponding to FIG. 32 according to illustrative embodiments of the present disclosure.

As shown in FIG. 37, in an illustration according to some embodiments of the present invention, each array 22 of components 20 transferred (e.g., micro-transfer printed) in operations 2-G (e.g., stamp operations) is offset, interlaced, and rotated with respect to array 22 of components 20 transferred (e.g., micro-transfer printed) in operation 1 (e.g., a stamp operation) so that adjacent arrays 22 of components 20 transferred to destination substrate 40 are not picked up from adjacent arrays 22 of components 20 on component source wafer 10 and the arrays 22 of components 20 are interlaced and rotated. Thus, without wishing to be bound to any particular theory, the attribute 12 of components 20 varies less regularly or less significantly with respect to a local average with respect to position on destination substrate 40 and can thus be less objectionable to the human visual system (e.g., for example if components 20 are light-emitting diodes in a display). For example, as shown in FIG. 37, two-by-two or four-by-four arrays 22 of adjacent components 20 on destination substrate 40 can have average attribute 12 values that have less variation than two-by-two or four-by-four arrays 22 of adjacent components 20 on the component source wafer 10.

Figure 38:
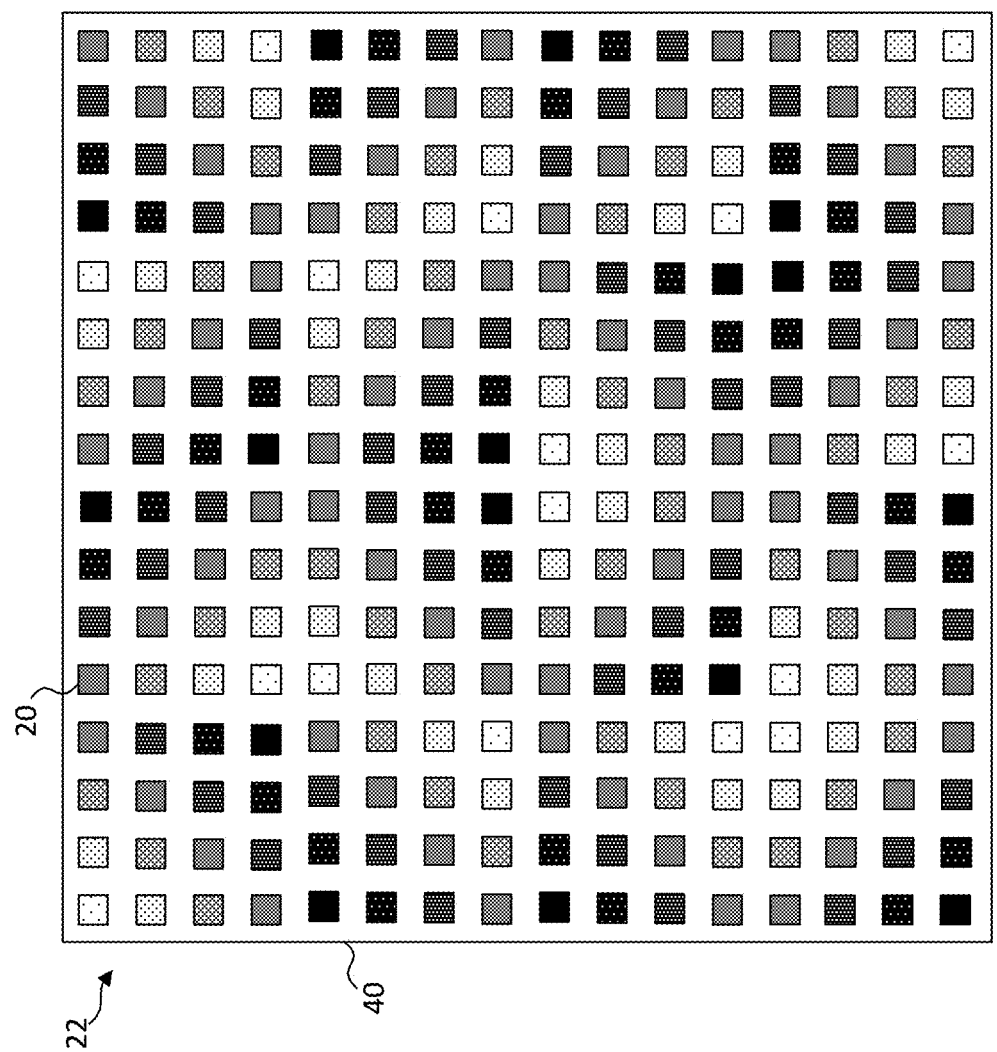
FIG. 38 is a plan view of a destination substrate with printed components from the native source substrate corresponding to FIG. 3 according to illustrative embodiments of the present disclosure.

FIG. 38 is an illustration according to some embodiments of the present disclosure wherein some of the arrays 22 of components 20 transferred (e.g., micro-transfer printed) in print steps 160 are rotated by different amounts with respect to others, for example some are not rotated, some are rotated 90 degrees, some are rotated 180 degrees, and some are rotated 270 degrees. The varying rotations reduce the systematic changes in attribute 12 and at least apparently randomize the changes in attribute 12 of components 20 distributed over destination substrate 40.

In some embodiments, a method comprises repeatedly transferring arrays 22 of components 20 from component source wafer 10 to destination substrate 40 N times in one dimension, where N/2 pairs of adjacent arrays 22 of components 20 on destination substrate 40 comprise array 22 i and array 22 (N−1−i) for each i from 0 to (N/2)−1.

For example, referring to FIG. 2, a horizontal one-dimensional array of sixteen components 20 (e.g., the top row of FIG. 2) has a monotonically changing attribute 12. Referring to FIG. 27, the components 20 are reordered in the same horizontal direction by transferring four groups (arrays 22) of four components 20 each (thus, in this example N=4 and i equals 0, 1, 2, and 3). (Note that the physical spacing of components 20 in FIG. 27 is one quarter that of FIG. 2.) If adjacent groups of four are sampled, as in FIG. 27, then components from group i=0 are transferred adjacent to components 20 from group i=1. Similarly, components 20 from group i=1 are also adjacent to components 20 from group i=2 and components 20 from group i=2 are also adjacent to components 20 from group i=3, so that the components 20 have attributes 12 ordered as 1, 2, 3, 4 in four horizontally adjacent arrays, as shown in FIG. 27. In contrast, according to the equation above and for some embodiments of the present invention, for arrays from zero to (N/2)−1=1, if components from group i=0 are disposed adjacent to components from group i=3 (because N−1−I=4−1−0=3) and components from group i=1 are disposed adjacent to components from group i=2 (because N−1−I=4−1−1=2), so that the components 20 have attributes 12 ordered as 1, 4, 2, 3, the changes in attribute 12 in the horizontal direction are no longer monotonic and the visibility or objectionability of the variation can be therefore reduced.

In some embodiments, a method of the present disclosure, comprises repeatedly transferring arrays 22 of components 20 from component source wafer 10 to destination substrate 40 N×M times in two dimensions, where N/2×M/2 two-by-two adjacent component arrays 22 on destination substrate 40 comprise array 22 (i, j), array 22 (N−1−i, j), array 22 (i, M−1−j), and array 22 (N−1−i, M−1−j) for each i from 0 to (N/2)−1 and each j from 0 to (M/2)−1. Thus, components 20 in different arrays 22 are interlaced in one or two dimensions. By transferring different arrays 22 of components 20 in such a manner, a variation in attributes 12 may be made less regular, less visible, or less objectionable; arrays 22 of components 20 on destination substrate 40 (after transfer) are mixed up with respect to the corresponding arrays 22 of components 20 on component source wafer 10 (before transfer). The two-dimensional case operates as described above with the one-dimensional case except in two orthogonal directions at the same time.

Figure 39:
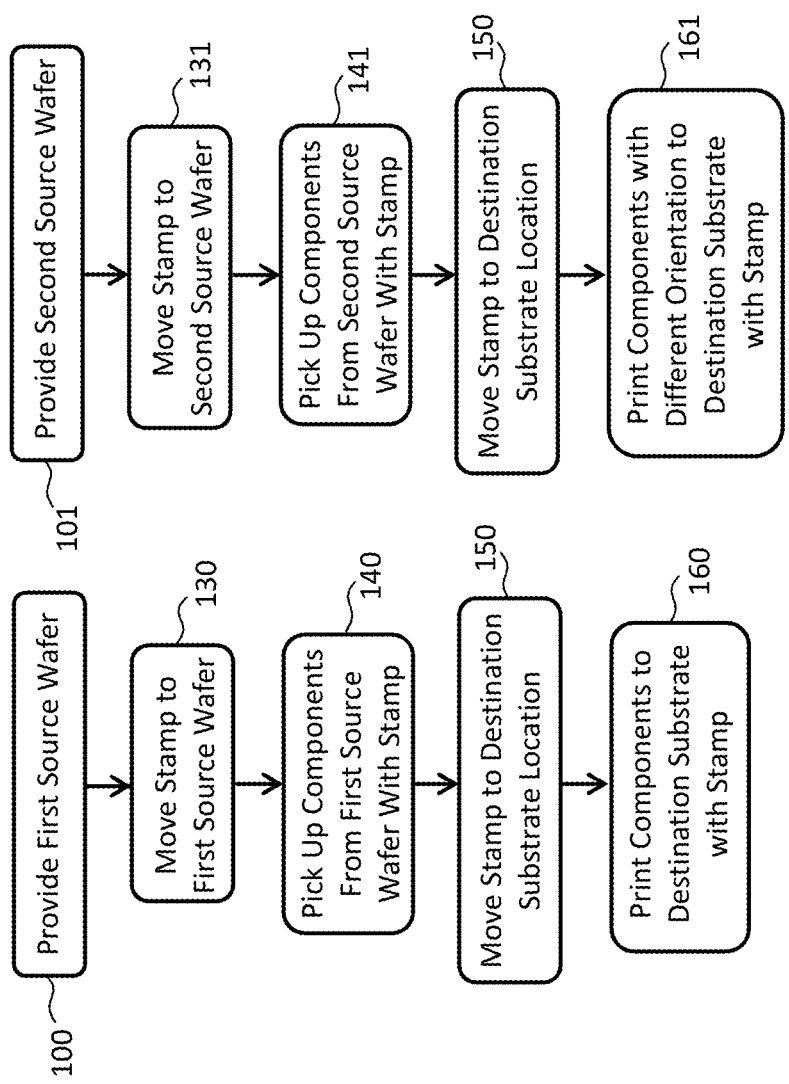
FIG. 39 is a flow diagram according to illustrative embodiments of the present disclosure.

In some embodiments and as illustrated in FIG. 39, a method comprises transferring a plurality of component source wafers 10 and arrays 22 of components 20 from each component source wafer 10 onto destination substrate 40 with two or more different orientations. For example, the plurality of component source wafers 10 can comprise a first component source wafer 10 and a second component source wafer 10 different from the first component source wafer 10, provided in steps 100 and 101. The method can comprise interlacing (e.g., interdigitating) components 20 from first component source wafer 10 between components 20 from second component source wafer 10 for example by using the same or different stamps 30 to pick up components 20 from first and second component source wafers 10 in steps 130, 131 and 140, 141 respectively, move the stamp 30 to destination substrate 40 in step 150, and print components 20 to destination substrate 40 in step 160 with an orientation and print components 20 to destination substrate 40 in step 161 with a different orientation. In some embodiments, different component source wafers 10 have different kinds or types of components 20. For example, components 20 can be LEDs and the different component source wafers 10 can each include LEDs that emit a different color of light. For example, in some embodiments, each of three component source wafers 10 includes one of red, green, and blue LEDs that emit red, green, or blue light, respectively, and the different LEDs are transferred with different orientations. Sets of three different LEDS can comprise pixels in a display and destination substrate 40 can be a display substrate.

Displays having same and different color arrays 22 of LED components 20 of micro-transfer printed from one or more component source wafers 10 to a destination substrate 40 using multiple orientations have been constructed and visually examined and shown to have less visible variation in color and brightness.

In some embodiments of the present disclosure, the order in which components 20 are printed (e.g., front right components 20 on a stamp 30 versus back left components 20 on a stamp 30) is arbitrary.

According to some embodiments of the present disclosure, micro-transfer printing includes transferring components 20 from a source substrate (e.g., component source wafer 10) to a destination substrate (e.g., destination substrate 40) by contacting components 20 on the source substrate with a stamp 30 to remove components 20 from the source substrate, transferring stamp 30 and contacted components 20 to the destination substrate 40, and contacting components 20 to a surface of the destination substrate 40. Components 20 can be adhered to stamp 30 or the destination substrate 40 by, for example, one or more of van der Waals forces, electrostatic forces, magnetic forces, chemical forces, and adhesive forces (e.g., from an adhesive). In some embodiments of the present disclosure, components 20 are adhered to stamp 30 with separation-rate-dependent adhesion, for example kinetic control of viscoelastic stamp materials such as can be found in elastomeric devices such as a PDMS stamp 30. Stamps 30 can comprise stamp posts 32 having a stamp post area on the distal end of stamp posts 32. Stamp posts 32 can have a length, a width, or both a length and a width, similar or substantially equal to a length, a width, or both a length and a width of component 20. In some embodiments, as discussed further below, stamp posts 32 of a stamp 30 can be smaller than components 20 in one or two orthogonal directions.

In exemplary methods, a stamp 30 (e.g., a viscoelastic elastomer stamp, such as a stamp optionally comprising a plurality of stamp posts 32) is designed and fabricated to retrieve and transfer arrays 22 of components 20 from their native component source wafer 10 onto non-native destination substrates 40. In some embodiments, stamp 30 mounts onto motion-plus-optics machinery (e.g., an opto-mechatronic motion platform) that can precisely control stamp 30 alignment and kinetics with respect to both component source wafers 10 and destination substrates 40. During micro-transfer printing, the motion platform brings stamp 30 into contact with components 20 on component source wafer 10, with optical alignment performed before contact. For example, in some embodiments, light can be transmitted and/or received through stamp 30 (e.g., through one or more stamp posts 32) in order to perform an optical alignment.

Rapid upward movement of the print-head fractures component tether(s) 52 forming fractured component tethers 53, transferring component(s) 20 to stamp 30 or stamp posts 32. The populated stamp 30 then travels to destination substrate 40 and one or more components 20 are then aligned (e.g., in a manner similar to for pick-up) to destination substrate 40 and printed.

A component source wafer 10 can be any source wafer or substrate with micro-transfer printable components 20 that can be transferred with a stamp 30. For example, a component source wafer 10 can be or include a semiconductor (e.g., silicon) in a crystalline or non-crystalline form, a compound semiconductor (e.g., comprising GaN or GaAs), or a glass, polymer, sapphire, or quartz wafer. Sacrificial portions 14 can be formed of a patterned oxide (e.g., silicon dioxide) or nitride (e.g., silicon nitride) layer or can be an anisotropically etchable portion of sacrificial layer 11 of component source wafer 10. Typically, but not necessarily, component source wafers 10 are smaller than destination substrates 40.

Exemplary components 20 include active, passive, and active and passive components 20. Exemplary components 20 include, but are not limited to, any one or more of integrated devices, integrated circuits (such as CMOS circuits), light-emitting diodes, photodiodes, sensors, electrical or electronic devices, optical devices, opto-electronic devices, magnetic devices, magneto-optic devices, magneto-electronic devices, and piezo-electric device, materials or structures. Components 20 can comprise electronic component circuits that operate component 20. Components 20 can be responsive to electrical energy, to optical energy, to electromagnetic energy, to mechanical energy, or to a combination thereof. In some embodiments, a component 20 is a light-emitting diode (LED).

Components 20 formed or disposed in or on component source wafers 10 can be constructed using, for example, one or more of integrated circuit, micro-electro-mechanical, and photolithographic methods. Components 20 can comprise one or more different component materials, for example, non-crystalline or crystalline semiconductor materials such as silicon or compound semiconductor materials or non-crystalline or crystalline piezo-electric materials.

In some embodiments of the present disclosure, components 20 can be native to and formed on sacrificial portions 14 of component source wafers 10 and can include one or more seed layers used for constructing crystalline layers on or in component source wafers 10. In some examples, components 20, sacrificial portions 14, anchors 50, and component tethers 52 can be constructed using photolithographic processes. Components 20 can be micro-devices having at least one of a length and width no more than 200 microns (e.g., no more than 100 microns, no more than 50 microns, no more than 25 microns, no more than 15 microns, no more than 10 microns, or no more than five microns), and, optionally, a thickness of no more than 50 microns (e.g., no more than 25 microns, no more than 15 microns, no more than 10 microns, no more than five microns, no more than two microns, or no more than one micron). In some embodiments, components 20 can be unpackaged dice (each an unpackaged die) transferred directly from native component source wafers 10 on or in which components 20 are constructed to destination substrate 40 (without wafer dicing).

Anchors 50 and component tethers 52 can be or can comprise portions of component source wafer 10 that are not sacrificial portions 14 and can include layers formed on component source wafers 10, for example dielectric or metal layers and for example layers formed as a part of photolithographic processes used to construct or encapsulate components 20.

Destination substrate 40 can be any destination substrate or target substrate to which components 20 are transferred (e.g., micro-transfer printed), for example flat-panel display substrates, printed circuit boards, or similar substrates. Destination substrates 40 can be, for example substrates comprising glass, polymer, quartz, ceramics, metal, or sapphire. Destination substrates 40 can be semiconductor substrates (for example silicon) or compound semiconductor substrates and can have multiple layers.

In some embodiments of the present disclosure, a layer of adhesive, such as a layer of resin, polymer, or epoxy, either curable or non-curable, adheres components 20 onto destination substrate 40 and can be disposed, for example by coating or lamination. In some embodiments, the layer of adhesive is disposed in a pattern, for example using inkjet, screening, or photolithographic techniques. In some embodiments, a layer of adhesive is coated, for example with a spray or slot coater, and then patterned, for example using photolithographic techniques.

Patterned electrical conductors (e.g., wires, traces, or electrical contact pads such as those found on printed circuit boards, flat-panel display substrates, and in thin-film circuits) can be formed on any one or combination of one or more components 20 and destination substrate 40. One or more electrical contact pads can be in or on destination substrate 40 and/or in or on one or more components 20 to electrically connect components 20. Such patterned electrical conductors and contact pads can comprise, for example metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in microchannels in or on destination substrate 40.

Micro-transfer printing processes suitable for disposing components 20 onto destination substrates 40 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety.

For a discussion of micro-transfer printing techniques, see also U.S. Pat. Nos. 7,622,367 and 8,506,867, each of which is hereby incorporated by reference in its entirety. Micro-transfer printing using compound micro-assembly structures and methods can also be used with the present disclosure, for example, as described in U.S. patent application Ser. No. 14/822,868, filed Aug. 10, 2015, entitled Compound Micro-Assembly Strategies and Devices, which is hereby also incorporated by reference in its entirety. Accordingly, in some embodiments, printed structure 99 is a compound micro-assembled structure.

According to various embodiments of the present disclosure, component source wafer 10 can be provided with components 20, patterned sacrificial portions 14, component tethers 52, and anchors 50 already formed, or they can be constructed as part of a method. Component source wafer 10, components 20, stamp 30, and destination substrate 40 can be made separately and at different times or in different temporal orders or locations and provided in various process states.

The spatial distribution of components 20 on a component source wafer 10 or printed structures 99 is a matter of design choice for the end product desired. In some embodiments of the present disclosure, all components 20 in an array 22 on a component source wafer 10 are transferred to a stamp 30. In some embodiments, a subset of components 20 in an array 22 on a component source wafer 10 is transferred. By varying the number and arrangement of stamp posts 32 on transfer stamps 30, the distribution of components 20 on stamp posts 32 of the transfer stamp 30 can be likewise varied, as can the distribution of components 20 on destination substrate 40.

Because components 20, in certain embodiments, can be made using integrated circuit photolithographic techniques having a relatively high resolution and cost and destination substrate 40, for example a printed circuit board, can be made using printed circuit board techniques having a relatively low resolution and cost, electrical conductors and substrate contact pads on destination substrate 40 can be much larger than electrical contacts or component electrodes on component 20, thereby reducing manufacturing costs. For example, in certain embodiments, micro-transfer printable component 20 has at least one of a width, length, and height from 0.5 μm to 200 μm (e.g., 0.5 to 2 μm, 2 to 5 μm, 5 to 10 μm, 10 to 20 μm, 20 to 50 μm, 50 to 100 μm, or 100 to 200 μm).

In certain embodiments, destination substrate 40 is or comprises a member selected from the group consisting of polymer, plastic, resin, polyimide, PEN, PET, metal, metal foil, glass, a semiconductor, and sapphire. In certain embodiments, destination substrate 40 has a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm).

Components 20, in certain embodiments, can be constructed using foundry fabrication processes used in the art. Layers of materials can be used, including materials such as metals, oxides, nitrides and other materials used in the integrated-circuit art. Each component 20 can be or include a complete semiconductor integrated circuit and can include, for example, transistors, diodes, light-emitting diodes, or sensors. Components 20 can have different sizes, for example, each having an area of 100 square microns or larger, 1000 square microns or larger or 10,000 square microns or larger, 100,000 square microns or larger, or 1 square mm or larger. Components 20 can have variable aspect ratios, for example between 1:1 and 10:1 (e.g., 1:1, 2:1, 5:1, or 10:1). Components 20 can be rectangular or can have other shapes.

Various embodiments of structures and methods are described herein. Structures and methods were variously described as transferring components 20, printing components 20, or micro-transfer printing components 20 as examples and the particular word used should be understood to be non-limiting as to the methods that may be used to implement the described embodiments. In some embodiments, micro-transfer-printing includes using a stamp 30 (e.g., an elastomeric stamp 30, such as a PDMS stamp 30) to transfer a component 20 using controlled adhesion. For example, an exemplary stamp 30 can use kinetic or shear-assisted control of adhesion between the stamp 30 and a component 20. It is contemplated that, in certain embodiments, where a method is described as including printing (e.g., micro-transfer-printing) a component 20, other analogous embodiments exist using a different transfer method. As used herein, transferring a component 20 (e.g., from a component source wafer 10 or wafer to a destination substrate 40) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a stamp 30 is a vacuum tool or other transfer device used to transfer components 20. In some embodiments, a stamp 30 uses one or more of electrostatic forces, magnetic forces, and vacuum forces to transfer components 20 (e.g., applied to individual components 20 by individual stamp posts 32).

As is understood by those skilled in the art, the terms "over" and "under" are relative terms and can be interchanged in reference to different orientations of the layers, elements, and substrates included in the present disclosure. Furthermore, a first layer "on" a second layer is a relative orientation of the first layer to the second layer that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., an in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

The disclosure has been described in detail with particular reference to certain embodiments thereof, but it will be understood that variations and modifications can be effected within the spirit and scope of the disclosure.

PARTS LIST

A cross section line
10 component source wafer
11 sacrificial layer
12 attribute/structure/epitaxial (epi) layer
14 sacrificial portions
16 gap
20 component
20a-20j component
22 array
30 stamp
32 stamp post
40 destination substrate
50 anchor
52 component tether
53 fractured component tether
54 dielectric layer
99 printed structure
100 provide component source wafer step
110 provide stamp step
120 provide destination substrate step
130 move stamp to component source wafer step
131 move stamp to second component source wafer step
140 pick up components from component source wafer with stamp step
141 pick up components from second component source wafer with stamp step
145 rotate source wafer
150 move stamp to destination substrate location step
160 print components to destination substrate with stamp step
161 print components with different orientation to destination substrate with stamp step
170 done step
180 complete step

What is claimed:

1. A method of micro-transfer printing, comprising:
providing a component source wafer and components disposed in, on, or over the component source wafer, providing a destination substrate, and providing a stamp for transferring components from the component source wafer to the destination substrate, wherein structure, operation, appearance, or performance of different ones of the components in different locations varies across the component source wafer;
transferring, with the stamp, a first array of components from the component source wafer to the destination substrate with a first orientation of the components on the destination substrate; and
transferring, with the stamp, a second array of components from the component source wafer to the destination substrate with a second orientation of the components on the destination substrate, wherein the second orientation of the components on the destination substrate is different from the first orientation of the components on the destination substrate.

2. The method of claim 1, wherein the second orientation is rotated relative to the first array to provide different first and second orientations.

3. The method of claim 2, wherein the second orientation is rotated 90 degrees or 270 degrees with respect to the first orientation.

4. The method of claim 2, wherein the second orientation is rotated 180 degrees with respect to the first orientation.

5. The method of claim 1, comprising transferring the second array of components adjacent to the first array of components on the destination substrate.

6. The method of claim 1, comprising repeatedly transferring arrays of components from the component source wafer to the destination substrate with adjacent arrays on the destination substrate transferred at different orientations.

7. The method of claim 6, comprising repeatedly transferring arrays of components from the component source wafer to the destination substrate N times in one dimension, where N/2 pairs of adjacent arrays on the destination substrate comprise array i and array (N−1−i) for each i from 0 to (N/2)−1.

8. The method of claim 6, comprising repeatedly transferring arrays of components from the component source wafer to the destination substrate N×M times in two dimensions, where N/2×M/2 two-by-two adjacent component arrays on the destination substrate comprise array (i, j), array (N−1−i, j), array (i, M−1−j), and array (N−1−i, M−1−j) for each i from 0 to (N/2)−1 and each j from 0 to (M/2)−1.

9. The method of claim 1, comprising interlacing the second array with respect to the first array in at least one dimension to provide different first and second orientations.

10. The method of claim 9, wherein the interlacing is in two dimensions.

11. The method of claim 1, wherein the first array and the second array are each regular spatial arrangements of components in one dimension on the destination substrate.

12. The method of claim 1, wherein the first array and the second array are each regular spatial arrangements of components in two dimensions on the destination substrate.

13. The method of claim 1, comprising offsetting the second array with respect to the first array on the destination substrate by an amount that is different from an offset of the first array with respect to the second array on the component source wafer to provide different first and second orientations.

14. The method of claim 13, wherein the second array is disposed with respect to the first array on the destination substrate in a different direction than the second array is disposed with respect to the first array on the component source wafer.

15. The method of claim 13, wherein the first array and second array are adjacent on the component source wafer before transferring but are not adjacent on the destination substrate after transferring.

16. The method of claim 1, comprising:
providing a plurality of component source wafers, wherein the plurality of component source wafers comprises the component source wafer; and
comprising transferring arrays of components from each of the component source wafers onto the destination substrate with two or more different orientations.

17. The method of claim 16, wherein the plurality of component source wafers comprises a first component source wafer and a second component source wafer different from the first component source wafer, and the method comprises interlacing components from the first component source wafer between components from the second component source wafer.

18. The method of claim 1, wherein the components are light-emitting components.

19. The method of claim 1, wherein the components are inorganic light-emitting diodes.

20. A method of micro-transfer printing, comprising:
providing a component source wafer and components disposed in, on, or over the component source wafer, providing a destination substrate, and providing a stamp, wherein a structure, operation, or performance of different ones of the components disposed in different locations in, on, or over the component source wafer varies across the component source wafer;
transferring, with the stamp, a first array of components from the component source wafer to the destination substrate with a first orientation of the components on the destination substrate; and
transferring, with the stamp, a second array of components from the component source wafer to the destination substrate with a second orientation of the components on the destination substrate, wherein the second orientation of the components on the destination substrate is different from the first orientation of the components on the destination substrate.

* * * * *